United States Patent [19]
Yasuda et al.

[11] Patent Number: 5,895,924
[45] Date of Patent: *Apr. 20, 1999

[54] CHARGED PARTICLE BEAM EXPOSURE METHOD AND APPARATUS

[75] Inventors: Hiroshi Yasuda; Akio Yamada; Kazushi Ishida; Tohru Ikeda; Kouzi Takahata, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/602,350

[22] Filed: Feb. 16, 1996

[30] Foreign Application Priority Data

Apr. 6, 1995 [JP] Japan ..................... 7-081448

[51] Int. Cl.$^6$ ......................................... H01J 37/00
[52] U.S. Cl. ...................... 250/492.22; 250/398
[58] Field of Search ................... 250/492.22, 398, 250/492.23, 492.2

[56] References Cited

U.S. PATENT DOCUMENTS

| | | | |
|---|---|---|---|
| 4,142,132 | 2/1979 | Harte | 250/492.2 |
| 4,390,789 | 6/1983 | Smith et al. | 250/492.2 |
| 4,467,211 | 8/1984 | Smith et al. | 250/492.2 |
| 4,694,178 | 9/1987 | Harte | 250/492.2 |
| 5,173,582 | 12/1992 | Sakamoto et al. | 219/121.25 |
| 5,194,741 | 3/1993 | Sakamoto et al. | 250/492.2 |

FOREIGN PATENT DOCUMENTS

| | | |
|---|---|---|
| 62-098724 | 5/1987 | Japan . |
| 1-020619 | 1/1989 | Japan . |
| 4-129212 | 4/1992 | Japan . |

*Primary Examiner*—Kiet T. Nguyen
*Attorney, Agent, or Firm*—Staas & Halsey

[57] ABSTRACT

A charged particle beam exposure method is adapted to an exposure apparatus which includes a plurality of exposure systems that simultaneously expose the same pattern. The method includes the steps of (a) generating, by a pattern generating unit in each exposure system, data related to patterns which are to be exposed, (b) deflecting, by a column unit in each exposure system, a charged particle beam onto an object which is mounted on a stage by deflecting the charged particle beam based on the data generated by the pattern generating unit in a corresponding exposure system, and (c) detecting an abnormality in the exposure apparatus during operation of the exposure apparatus based on data which are obtained from corresponding parts of the exposure systems.

24 Claims, 15 Drawing Sheets

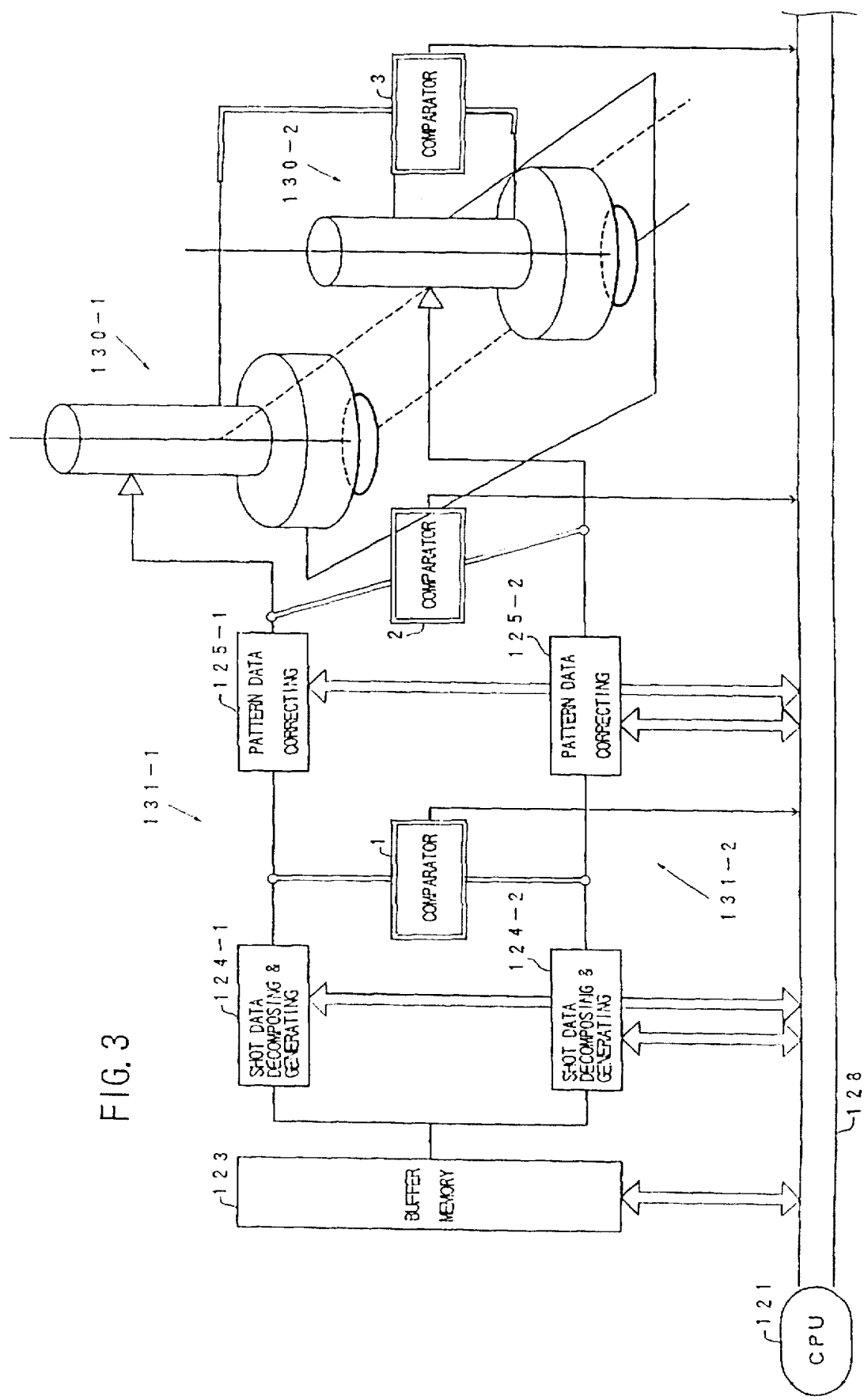

CHARGED PARTICLE BEAM EXPOSURE METHOD AND APPARATUS

BACKGROUND OF THE INVENTION

The present invention generally relates to charged particle beam exposure methods and apparatuses, and more particularly to a charged particle beam exposure method and a a charged particle beam exposure apparatus which use a plurality of charged particle beam columns.

Recently, due to the high integration densities of semiconductor integrated circuits, the exposure techniques (lithography techniques) used to form patterns on a semiconductor wafer are changing from the photolithography techniques which were primarily used in the past to the charged particle beam exposure techniques which employ a charged particle beam typified by the electron beam. The charged particle beam exposure techniques are capable of exposing extremely fine patterns.

The charged particle beam exposure techniques include the so-called variable rectangular exposure technique, the block exposure technique and the like depending on the shapes of the patterns that can be generated at one time. According to the variable rectangular exposure technique, the size of the rectangles that are exposed is varied, and a desired pattern is exposed by successively exposing the variable size rectangles. On the other hand, according to the block exposure technique, the charged particle beam is transmitted through a mask having repeating basic unit patterns, and even a complicated pattern is exposed in one shot using a unit pattern. Hence, the block exposure technique is particularly effective when the pattern is extremely fine but virtually the entire area to be exposed is a repetition of the basic pattern, such as the case of a 256 Mbit dynamic random access memory (DRAM) pattern.

FIG. 1 is a diagram showing an example of a conventional electron beam exposure apparatus employing the block exposure. The electron beam exposure apparatus includes an electron gun 101, an electron lens system L1a, a plate 102 with a rectangular aperture, an electron lens system L1b, a beam shaping deflector 103, a first mask deflector MD1, a dynamic mask stigmator DS, a second mask deflector MD2, a dynamic mask focus coil DF, an electron lens system L2a, a mask stage 105 on which a block mask 104 is mounted, an electron lens system L2b, a third mask deflector MD3, a blanking deflector 106, a fourth mask deflector MD4, a reduction electron lens system L3, a circular aperture stop 107, a projection electron lens system L4, a main deflector (electromagnetic deflector) 108, a sub deflector (electrostatic deflector) 109, a projection electron lens system L5, a wafer stage 111 on which a wafer 110 is mounted, and a control system 131. Those parts other than the control system 131 form an electron beam column 130 of the electron beam exposure apparatus.

On the other hand, the control system 131 includes a central processing unit (CPU) 121, a clock unit 122 which generates various clock signals including an exposure clock, a buffer memory 123, a control unit 124, a data correction unit 125, a mask memory 126, and a main deflector setting unit 127. The CPU 121 which controls the operation of the entire electron beam exposure apparatus, the clock unit 122, the mask memory 126 and the main deflector setting unit 127 are coupled via a bus 128. In FIG. 1, it is assumed for the sake of convenience that the data correction unit 125 and the main deflector setting unit 127 include the functions of a digital-to-analog converter (DAC) and an analog amplifier. A laser interferometer which measures the position of the wafer stage 111, and a stage moving mechanism which moves the wafer stage 111 are respectively known from the disclosures of U.S. Pat. No. 5,173,582 and U.S. Pat. No. 5,194,741, for example, and an illustration and description thereof will be omitted in this specification.

An electron beam emitted from the electron gun 101 passes through the plate 102 and is deflected by the first and second deflectors MD1 and MD2 so as to pass a desired pattern portion on the block mask 104. The cross sectional shape of the electron beam is shaped by the pattern portion, and this electron beam is returned to the optical axis by the converging functions of the electron lens systems L2a and L2b and the deflecting functions of the third and fourth deflectors MD3 and MD4. Thereafter, the cross sectional area of the electron beam is reduced by the reduction electron lens system L3, and is irradiated on the wafer 110 via the projection electron lens systems L4 and L5, so as to expose the desired pattern on the wafer 110.

The buffer memory 123 stores exposure pattern data related to the patterns to be exposed on the wafer 110, block data related to mask patterns on the block mask 104 and the like. The exposure pattern data, the block data and the like are stored into the buffer memory 123 from a memory 129 of the CPU 121, which memory 129 is coupled to the bus 128. The exposure pattern data includes main deflection data to be supplied to the main deflector 108 and the like. In addition, the mask memory 126 stores data related to the relationships of the mask pattern positions that are measured in advance prior to the exposure and the deflection data, correction data for correcting the deflection data to be supplied to the dynamic mask stigmator DS and the dynamic mask focus coil DF and the like.

The exposure pattern data which are input by the CPU 121 and stored in the buffer memory 123 include pattern data codes PDC which indicate the mask patterns on the block mask 104 to be used for the exposure. The control unit 124 uses the pattern data code PDC, reads the deflection data for deflecting the electron beam to the position of the mask pattern to be used, and supplies the read deflection data to the first through fourth deflectors MD1 through MD4. In addition, the deflection data read from the mask memory 126 are also supplied to the data correction unit 125. The deflection data are read from the mask memory 126 based on the exposure clock which is generated from the clock unit 122.

On the other hand, the main deflector setting unit 127 reads the main deflection data from the buffer memory 123 based on the clock received from the clock unit 122, and supplies the read main deflection data to the main deflector 108. In addition, the deflection data of the sub deflector 109, the deflection data of the beam shaping deflector 103 and the deflection data of the blanking deflector 106 are decomposed into shot data in the control unit 124 depending on the data stored in the buffer memory 123. The shot data is supplied to the corresponding sub deflector 109, beam shaping deflector 103 and blanking deflector 106 via the data correction unit 125. In other words, the control unit 124 obtains the size of the electron beam when making the variable rectangular exposure and the deflection position of the electron beam on the block mask 104 depending on the data stored in the buffer memory 123, and supplies the size and deflection position information to the data correction unit 125. Each deflection data of the electron beam dependent on the pattern to be exposed and supplied from the control unit 124 is corrected in the data correction unit 125 based on the correction data read from the mask memory 126. The deflection data of the beam shaping deflector 103 determine the variable rectangular size of the cross section of the electron beam, and the deflection data of the blanking deflector 106 are set for each exposure shot.

FIGS. 2A and 2B are diagrams for explaining an example of the block mask 104 that is used to expose patterns of a memory. As shown in FIG. 2A, the block mask 104 is made up of a substrate 104a which is made of a semiconductor such as silicon or a metal, and a plurality of deflection areas 104-1 through 104-12 which are provided on this substrate 104a. A plurality of mask patterns are formed in each of the deflection areas 104-1 through 104-12. In the electron beam exposure apparatus which employs the block exposure, a range of the mask patterns that are selectable by deflecting the electron beam about a position on a certain mask stage 105 is fixed, and each of the deflection areas 104-1 through 104-12 have a range of a square having a side of 5 mm, for example, in correspondence with this range of the selectable patterns. For example, when carrying out the exposure by selecting a mask pattern within the deflection area 104-8, the mask stage 105 is moved so that the electron optical axis of the electron beam exposure apparatus approximately matches the center of the deflection area 104-8.

FIG. 2B shows the construction of the deflection area 104-8. For example, 48 block patterns can be arranged within this deflection area 104-8, and each block pattern can be recognized by the pattern data code PDC. In other words, the pattern data code PDC is an index for reading the contents of the mask memory 126 corresponding to each mask pattern based on the exposure clock from the clock unit 122, which exposure clock has a maximum frequency of 10 MHz, for example. As described above, the mask memory 126 stores data related to the relationships of the mask pattern positions that are measured in advance prior to the exposure and the deflection data, correction data for correcting the deflection data to be supplied to the dynamic mask stigmator DS and the dynamic mask focus coil DF and the like, for the purposes of deflecting the electron beam to each mask pattern position. These data are stored in the mask memory 126 by adjusting the electron beam in advance prior to the exposure, and obtaining the deflection data, correction data and the like with respect to the deflection area that is to be used.

As described above, in the electron beam exposure, the desired pattern is exposed on the wafer 110 by deflecting the electron beam to scan depending on the exposure pattern data. In this case, the number of times the electron beam is irradiated is on the order of 10 Mshots/chip or 1 Gshot/chip, and the period of the electron beam irradiation is approximately 100 ns. Such an extremely large number of shots must be accurately irradiated at a high speed to a predetermined position with a predetermined intensity. In addition, this exposure operation must continue in a stable manner.

However, the electron beam exposure apparatus is made up of mechanical parts such as the electron optical column and stage, and hardware parts such as the digital controller and analog amplifier. For this reason, it is impossible to avoid generation of an abnormality in the electron beam exposure apparatus. The abnormalities generated in the electron beam exposure apparatus include the beam fluctuation and the shot dropout.

The beam fluctuation in most cases is primarily caused by the discharge at the high voltage power supply and the electron gun part, the noise at the lens power supply, the effects of the external electromagnetic noise, the charge-up of the electron beam column, and the like. In other words, the cause of the beam fluctuation in most cases is found on the side of the electron beam column. In addition, the fail time varies from several µs to several hundred ms depending on the cause of the beam fluctuation, and the repetition frequency is various.

On the other hand, the shot dropout in most cases is primarily generated by the bit dropout, latch error and the like at the digital circuit and the digital circuit part such as the DAC. The shot dropout varies from a positional error of 1 shot to a positional error in units of patterns.

In the conventional electron beam exposure apparatus, the generation of the above described abnormalities in the electron beam exposure apparatus is only detected after inspecting the exposed patterns. In addition, when analyzing the cause of the abnormality, there was a problem in that the abnormality must be confirmed while monitoring the operation of the part which is considered to be the cause and waiting for the abnormality to actually occur.

In addition, in order to accurately determine the cause of the abnormality in the electron beam exposure apparatus, it was normally necessary to generate the abnormality several tens of times. However, in the case of the abnormality which rarely occurs, it took an extremely long time to analyze the abnormality, and there was a problem in that the operating efficiency of the electron beam exposure apparatus greatly deteriorates.

SUMMARY OF THE INVENTION

Accordingly, it is a general object of the present invention to provide a novel and useful charged particle beam exposure method and apparatus, in which the problems described above are eliminated.

Another and more specific object of the present invention is to provide a charged particle beam exposure method and a charged particle beam exposure apparatus which can positively detect an abnormality during operation of the charged particle beam exposure apparatus, and can quickly determine the cause of the abnormality even in the case of an abnormality which does not occur frequently.

Still another object of the present invention is to provide a charged particle beam exposure method adapted to an exposure apparatus which includes a plurality of exposure systems that simultaneously expose the same pattern, comprising the steps of (a) generating, by pattern generating means in each exposure system, data related to patterns which are to be exposed, (b) deflecting, by column means in each exposure system, a charged particle beam onto an object which is mounted on a stage by deflecting the charged particle beam based on the data generated by the pattern generating means in a corresponding exposure system, and (c) detecting an abnormality in the exposure apparatus during operation of the exposure apparatus based on data which are obtained from corresponding parts of the exposure systems. According to the charged particle beam exposure method of the present invention, it is possible to positively detect the abnormality in the charged particle beam exposure apparatus during operation of the charged particle beam exposure apparatus, without the need to inspect the exposed objects. For this reason, it is possible to improve the reliability of the charged particle beam exposure apparatus. Furthermore, because a plurality of exposure systems are provided, the throughput of the exposure is also improved by an amount corresponding to the number of exposure systems provided.

A further object of the present invention is to provide the charged particle beam exposure method described above which further comprises the steps of (d) notifying error information to a host unit based on the data which are obtained from the corresponding parts of the exposure systems, where the error information at least includes a location where the abnormality is generated, a state of the abnormality and a system number of an exposure system in which the abnormality is detected. According to the charged particle beam exposure method of the present invention, it is possible to specify and repair the abnormality with ease.

Another object of the present invention is to provide the charged particle beam exposure method described above wherein the error information further includes a time when the abnormality is generated, and which further comprises the steps of (e) storing a log of the abnormality based on the notified error information. According to the charged particle beam exposure method of the present invention, it is possible to accurately specify which exposed objects exposed by which exposure system need to be inspected based on the log.

Still another object of the present invention is to provide the charged particle beam exposure method described above wherein the column means of the exposure systems respectively have objects mounted on independent stages, and which further comprises the steps of (d) moving the stages so as to counter-balance each other. According to the charged particle beam exposure method of the present invention, it is possible to positively prevent swaying of the column means.

A further object of the present invention is to provide a charged particle beam exposure apparatus comprising a plurality of exposure systems which simultaneously expose the same pattern, where each of the exposure systems comprises pattern generating means for generating data related to patterns which are to be exposed and column means for deflecting a charged particle beam onto an object which is mounted on a stage by deflecting the charged particle beam based on the data generated by the pattern generating means in a corresponding exposure system, and detecting means for detecting an abnormality in the charged particle beam exposure apparatus during operation of the charged particle beam exposure apparatus based on data which are obtained from corresponding parts of the exposure systems. According to the charged particle beam exposure apparatus of the present invention, it is possible to positively detect the abnormality in the charged particle beam exposure apparatus during operation of the charged particle beam exposure apparatus, without the need to inspect the exposed objects. For this reason, it is possible to improve the reliability of the charged particle beam exposure apparatus. Furthermore, because a plurality of exposure systems are provided, the throughput of the exposure is also improved by an amount corresponding to the number of exposure systems provided.

A further object of the present invention is to provide the charged particle beam exposure apparatus described above which further comprises notifying means for notifying error information to a host unit based on the data which are obtained from the corresponding parts of the exposure systems, where the error information at least includes a location where the abnormality is generated, a state of the abnormality and a system number of an exposure system in which the abnormality is detected. According to the charged particle beam exposure apparatus of the present invention, it is possible to specify and repair the abnormality with ease.

Another object of the present invention is to provide the charged particle beam exposure apparatus described above wherein the error information further includes a time when the abnormality is generated, and which further comprises means for storing a log of the abnormality based on the notified error information. According to the charged particle beam exposure apparatus of the present invention, it is possible to accurately specify which exposed objects exposed by which exposure system need to be inspected based on the log.

Still another object of the present invention is to provide the charged particle beam exposure apparatus described above wherein the column means of the exposure systems respectively have objects mounted on independent stages, and which further comprises means for moving the stages so as to counter-balance each other. According to the charged particle beam exposure apparatus of the present invention, it is possible to positively prevent swaying of the column means.

Other objects and further features of the present invention will be apparent from the following detailed description when read in conjunction with the accompanying drawings.

BRIEF DESCRIPTION OF THE DRAWINGS

FIG. 3 is a diagram showing a part of a first embodiment of a charged particle beam exposure apparatus according to the present invention;

DESCRIPTION OF THE PREFERRED EMBODIMENTS

Figure 1:
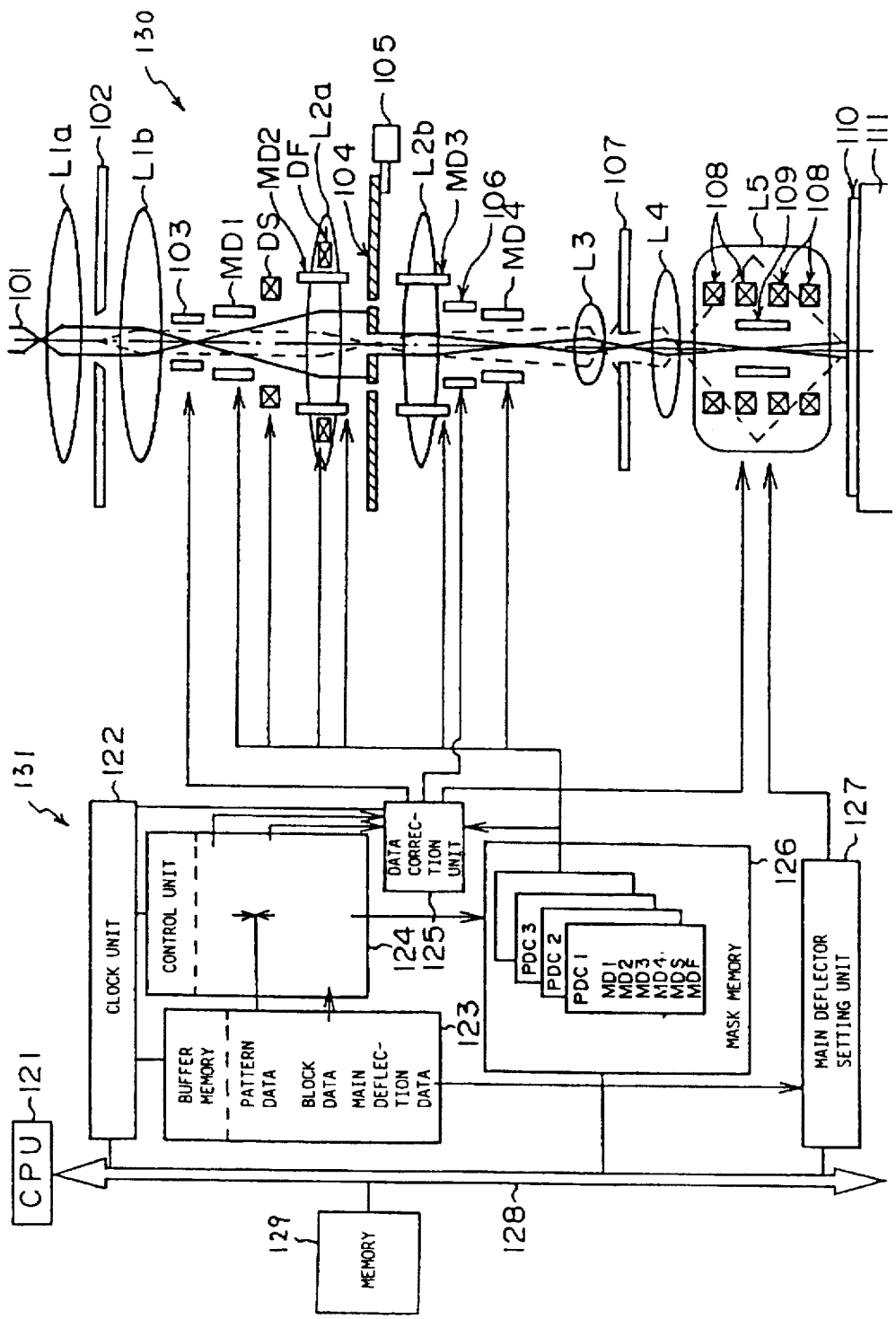
FIG. 1 is a diagram showing an example of a conventional electron beam exposure apparatus.
Figure 2A:
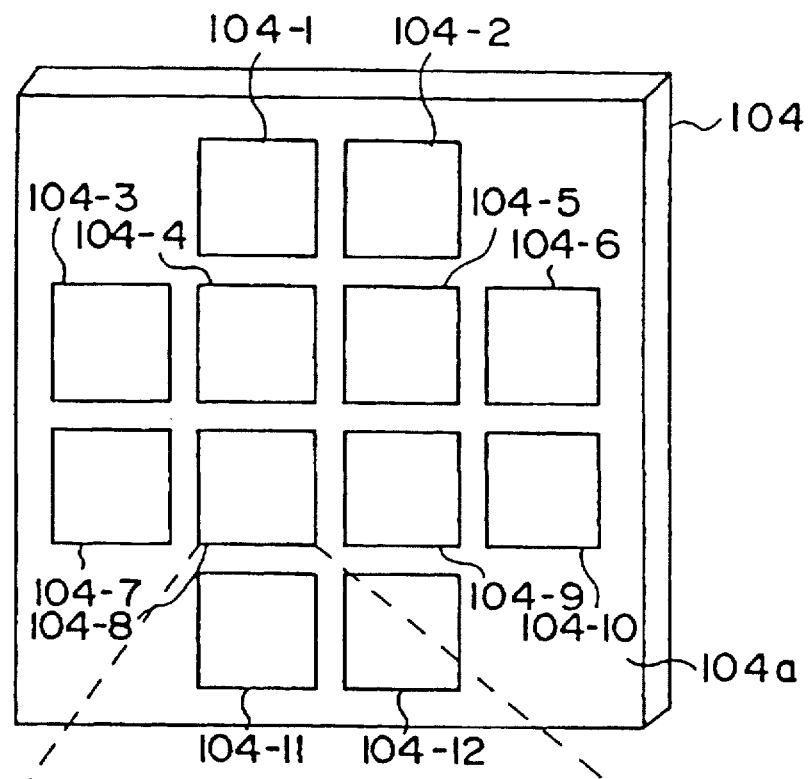
FIGS. 2A and 2B are diagrams for explaining an example of a block mask.
Figure 2B:
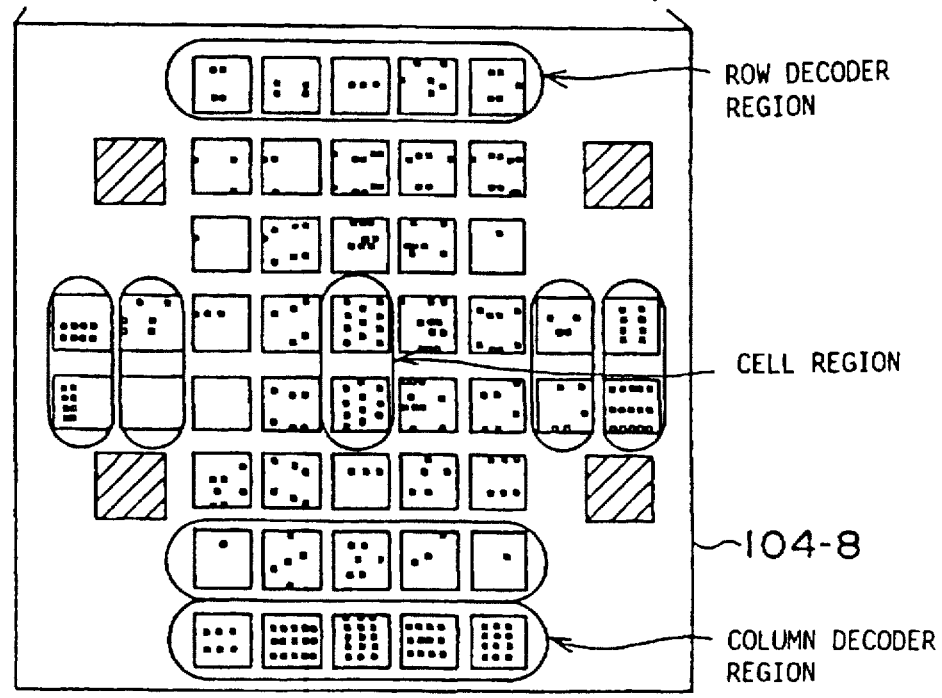

FIG. 3 is a system block diagram showing a part of a first embodiment of a charged particle beam exposure apparatus according to the present invention. In FIG. 3, those parts which are substantially the same as those corresponding parts in FIG. 1 are designated by the same reference numerals. In this embodiment, the present invention is applied to the electron beam exposure, and this embodiment employs a first embodiment of a charged particle beam exposure method according to the present invention.

In this embodiment, a shot data decomposing and generating part (pattern generating part), a pattern data correcting part, an electron beam column and the like are provided in two systems. On the other hand, a buffer memory is provided in only one system. A wafer is provided with respect to each electron beam column, but it is not essential to provide a wafer stage in 2 systems. In this embodiment, it will be assumed for the sake of convenience that two wafers are mounted on a single wafer stage in correspondence with the electron beam columns in the two systems.

In FIG. 3, the electron beam exposure apparatus includes two control systems 131-1 and 131-2, and two electron beam columns 130-1 and 130-2. The electron beam columns 130-1 and 130-2 respectively have the same construction as the electron beam column 130 shown in FIG. 1. On the other hand, the control systems 131-1 and 131-2 respectively have a construction which is basically similar to that of the control system 131 shown in FIG. 1, but in this embodiment, the buffer memory 123 is used in common by the two control systems 131-1 and 131-2. The control system 131-1 includes the buffer memory 123, a shot data decomposing and generating part 124-1 and a pattern data correcting part 125-1. The control system 131-2 includes the buffer memory 123, a shot data decomposing and generating part 124-2 and a pattern data correcting part 125-2.

In FIG. 3, the illustration of the clock unit 122, the mask memory 126, the main deflector setting unit 127 and the memory 129 will be omitted.

The shot data decomposing and generating parts 124-1 and 124-2 respectively decompose the identical pattern that is to be exposed and generate shot data based on the identical data read from the buffer memory 123. Hence, the shot data decomposing and generating parts 124-1 and 124-2 correspond to the control unit 124 shown in FIG. 1. In addition, the shot data output from the shot data decomposing and generating parts 124-1 and 124-2 are compared in a comparator part 1, and a comparison result from the comparator part 1 is notified to the CPU 121 via the bus 128.

The pattern data correcting parts 125-1 and 125-2 respectively correct the outputs of the shot data decomposing and generating parts 124-1 and 124-2, and supply corrected shot data to the corresponding electron beam columns 130-1 and 130-2. Hence, the pattern data correcting parts 125-1 and 125-2 correspond to the data correction unit 125 shown in FIG. 1. The correction process carried out in each of the pattern data correcting parts 125-1 and 125-2 includes an operation of correcting various coordinate transformations dependent on the corresponding one of the electron beam columns 130-1 and 130-2. The corrected shot data output from the pattern data correcting parts 125-1 and 125-2 are compared in a comparator part 2, and a comparison result from the comparator part 2 is notified to the CPU 121 via the bus 128. In addition, the corrected shot data output from the pattern data correcting parts 125-1 and 125-2 are supplied to the corresponding electron beam columns 130-1 and 130-2 via DACs and analog amplifiers. The DAC and the analog amplifier may be provided within each of the pattern data correcting parts 125-1 and 125-2 or, provided externally to each of the pattern data correcting parts 125-1 and 125-2.

Current values, reflected electron intensities and the like output from the electron beam columns 130-1 and 130-2 are compared in a comparator part 3, and a comparison result from the comparator part 3 is notified to the CPU 121 via the bus 128.

A first part of the electron beam exposure apparatus made up of the control system 131-1 and the electron beam column 130-1 and a second part of the electron beam exposure apparatus made up of the control system 131-2 and the electron beam column 130-2 are designed to simultaneously expose the same pattern based on the same data. For this reason, the pairs of data that are compared in the comparator parts 1, 2 and 3 should originally match at the same point in time unless an abnormality is generated in the electron beam exposure apparatus. However, in actual practice, there inevitably exist inconsistencies in the characteristics of each of the parts forming the first and second parts described above, and a slight error exists between the first and second parts.

Hence, the CPU 121 judges that no abnormality has occurred if the error between each pair of data compared in the comparator parts 2 and 3 falls within a tolerable range, for example. On the other hand, if the error between the pair of data compared in at least one of the comparator parts 2 and 3 falls outside the tolerable range, the CPU 121 judges that an abnormality has occurred and issues an alarm. In other words, it is possible to positively detect the generation of the abnormality without having to actually inspect the exposed patterns. In addition, the CPU 121 can specify the cause of the abnormality by judging which one or ones of the comparison results received from the comparator parts 1, 2 and 3 fall outside the tolerable range. Furthermore, the operation of detecting the abnormality and the operation of specifying the cause of the abnormality can be carried out during operation of the electron beam exposure apparatus, and no time loss is introduced in the exposure operation. By managing the time when the abnormality is generated and the time when the abnormality is removed, the CPU 121 can easily specify the exposed patterns which are exposed when the abnormality is generated and need to be inspected particularly.

Figure 4:
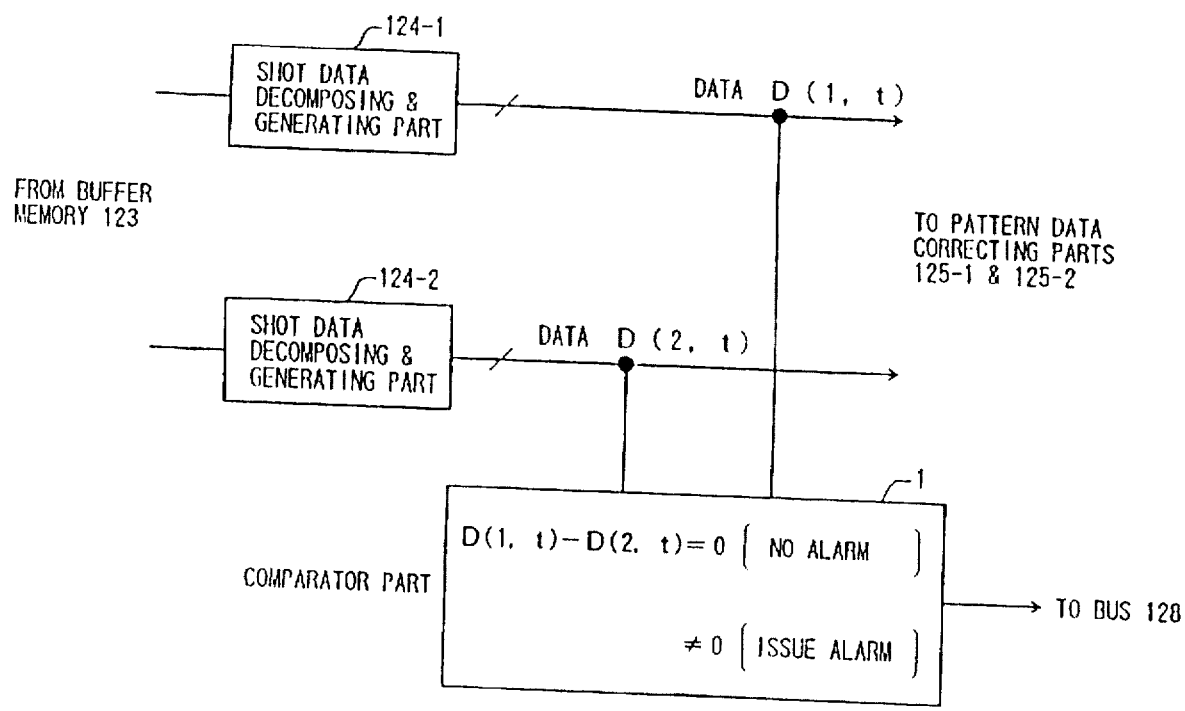
FIG. 4 is a system block diagram showing an embodiment of a data comparator part which makes a comparison after pattern generation.

FIG. 4 is a system block diagram showing an embodiment of a data comparator part which makes a comparison after pattern generation. In FIG. 4, those parts which are the same as those corresponding parts in FIG. 3 are designated by the same reference numerals, and a description thereof will be omitted.

In FIG. 4, the shot data decomposing and generating parts 124-1 and 124-2 simultaneously receive the same data from the buffer memory 123 and respectively decompose the data into shot data $D(1, t)$ and $D(2, t)$ by assigning numbers 1 and 2 to the 2 systems and representing the time by t.

The electron beam columns 130-1 and 130-2 expose the same pattern on the corresponding wafers, and thus, the shot data $D(1, t)$ and $D(2, t)$ must always match. The comparator part 1 outputs an error signal when the shot data $D(1, t)$ and $D(2, t)$ do not match, and this error signal is supplied to the CPU 121 via the bus 128.

Accordingly, the CPU 121 judges that the electron beam exposure apparatus is carrying out a normal operation when no error signal is received from the comparator part 1. On the other hand, if an error signal is received from the comparator part 1, the CPU 121 judges that an abnormality has occurred in the shot data decomposing and generating parts 124-1 and 124-2 or in parts on the upstream side thereof, that is, an abnormality has occurred in a part up to the pattern generating part, and the CPU 121 issues an alarm. In addition, the CPU 121 manages the generation of the error signal from the comparator part 1, the time when the error signal is generated, the time when the error signal ceased and the like as an error log.

Figure 5:
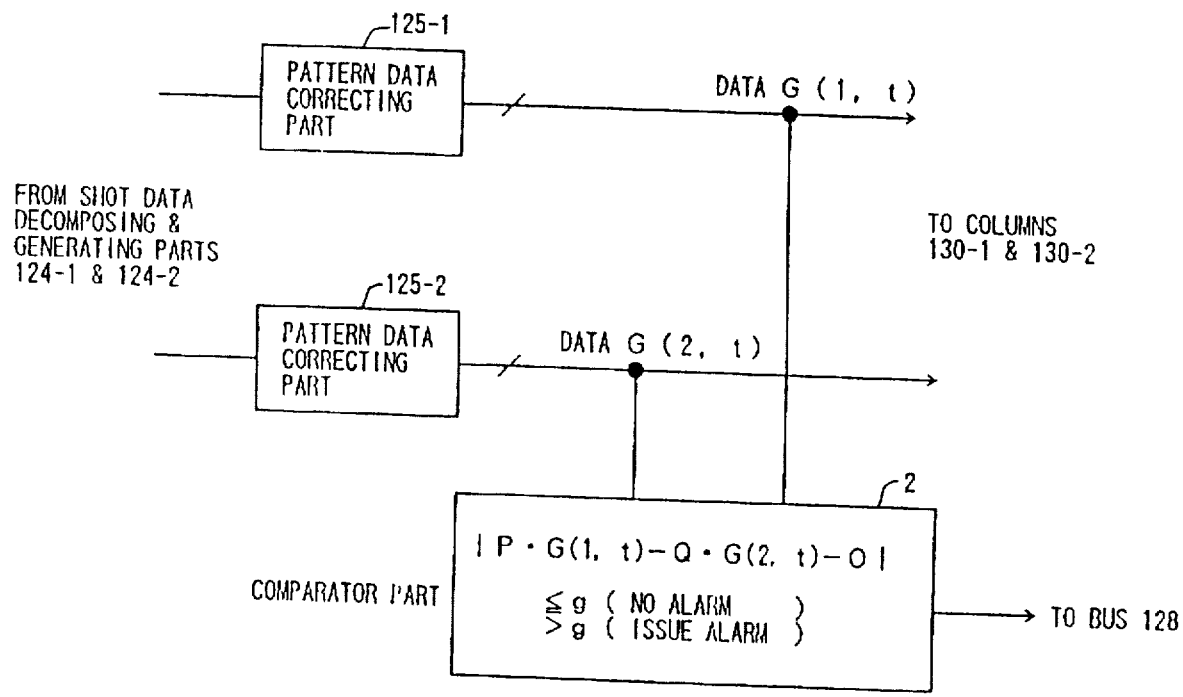
FIG. 5 is a system block diagram showing an embodiment of the data comparator part which makes a comparison after pattern data correction.

FIG. 5 is a system block diagram showing an embodiment of a data comparator part which makes a comparison after pattern data correction. In FIG. 5, those parts which are the same as those corresponding parts in FIG. 3 are designated by the same reference numerals, and a description thereof will be omitted.

In FIG. 5, the pattern data correcting parts 125-1 and 125-2 simultaneously receive the same shot data output from the corresponding shot data decomposing and generating parts 124-1 and 124-2 and respectively correct the shot data into pattern data G(1, t) and G(2, t) by assigning numbers 1 and 2 to the two systems and representing the time by t.

The electron beam columns 130-1 and 130-2 expose the same pattern on the corresponding wafers, and thus, the pattern data G(1, t) and G(2, t) must always match. However, in actual practice, the pattern data G(1, t) and G(2, t) slightly differ depending on the states of the corresponding electron beam columns 130-1 and 130-2. For this reason, the comparator part 2 outputs an error signal when the error between the pattern data G(1, t) and G(2, t) falls outside a predetermined range, and this error signal is supplied to the CPU 121 via the bus 128.

Therefore, the CPU 121 judges that the electron beam exposure apparatus is carrying out a normal operation when no error signal is received from the comparator part 2. On the other hand, if the error signal is received from the comparator part 2, the CPU 121 judges that an abnormality has occurred in the pattern data correcting parts 125-1 and 125-2 or in parts on the upstream side thereof, that is, an abnormality has occurred in a part up to the pattern correcting part, and the CPU 121 issues an alarm. In addition, the CPU 121 manages the generation of the error signal from the comparator part 2, the time when the error signal is generated, the time when the error signal ceased and the like as an error log.

The pattern data correcting parts 125-1 and 125-2 carry out correcting operations dependent on the states of the electron beam columns 130-1 and 130-2. Hence, unless the electron beam columns 130-1 and 130-2 are exactly in the same state, an error will exist between the pattern data G(1, t) and G(2, t) output from the pattern data correcting parts 125-1 and 125-2 depending on the column states. This error is not zero, but since the arrangements of the deflectors, wafers and the like in the two electron beam columns 130-1 and 130-2 match within a mechanical precision, the error between the pattern data G(1, t) and G(2, t) is considerably small compared to the correction quantity. Accordingly, a certain threshold value g is determined in the comparator part 2, and the comparator part 2 detects whether |P·G(1, t)−Q·G(2, t)−O|≦g or |P·G(1, t)−Q·G(2, t)−O|>g is satisfied, where P, Q and 0 are parameters for considering the differences between the column states. If the former condition is satisfied, the comparator part 2 will not generate an error signal. On the other hand, if the latter condition is satisfied, the comparator part 2 generates an error signal which is then supplied to the CPU 121 via the bus 128.

Figure 6:
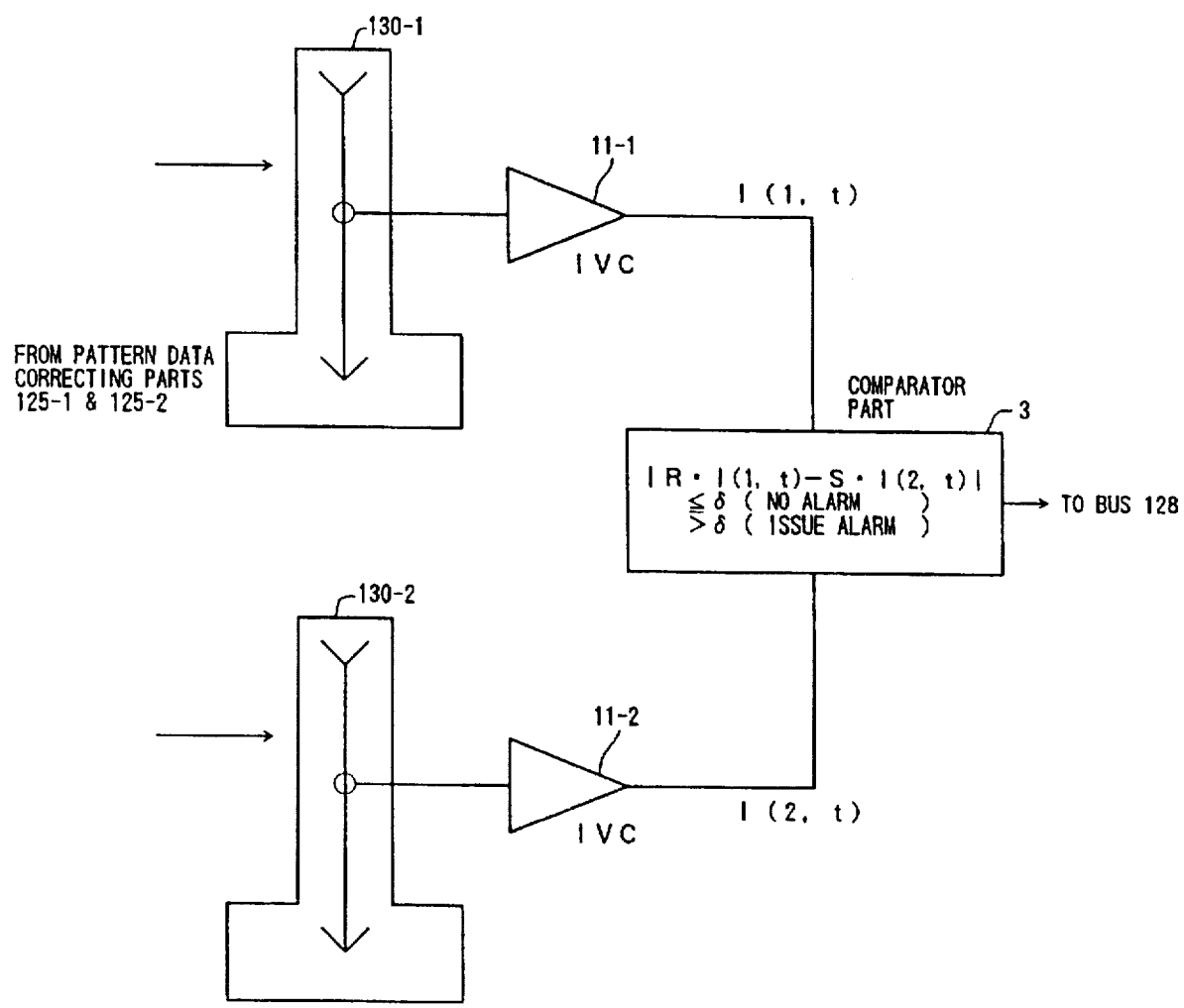
FIG. 6 is a system block diagram showing the embodiment of the data comparator part of an electron beam column part in more detail.

FIG. 6 is a system block diagram showing an embodiment of the data comparator part of the electron beam column part in more detail. In FIG. 6, those parts which are the same as those corresponding parts in FIG. 3 are designated by the same reference numerals, and a description thereof will be omitted.

In FIG. 6, the electron beam columns 130-1 and 130-2 simultaneously receive the same pattern data from the corresponding pattern data correcting parts 125-1 and 125-2, and expose the same pattern on the corresponding wafers. Current values of the electron beam columns 130-1 and 130-2 can be measured by known means at the circular aperture stops of the respective electron beam columns 130-1 and 130-2 or at the wafer stage part. In addition, in each of the electron beam columns 130-1 and 130-2, it is possible to measure the intensity of the electron reflected from the exposing surface of each wafer by known means. The measured current values or reflected electron intensities are integrated by corresponding current-to-voltage converters (IVCs) 11-1 and 11-2 with a time constant T of several hundred µs to several hundred ms. As a result, data I(1, t) and I(2, t) are respectively output from the IVCs 11-1 and 11-2 by assigning numbers 1 and 2 to the two systems and representing the time by t, and the data I(1, t) and I(2, t) are supplied to the comparator part 3.

Figure 7:
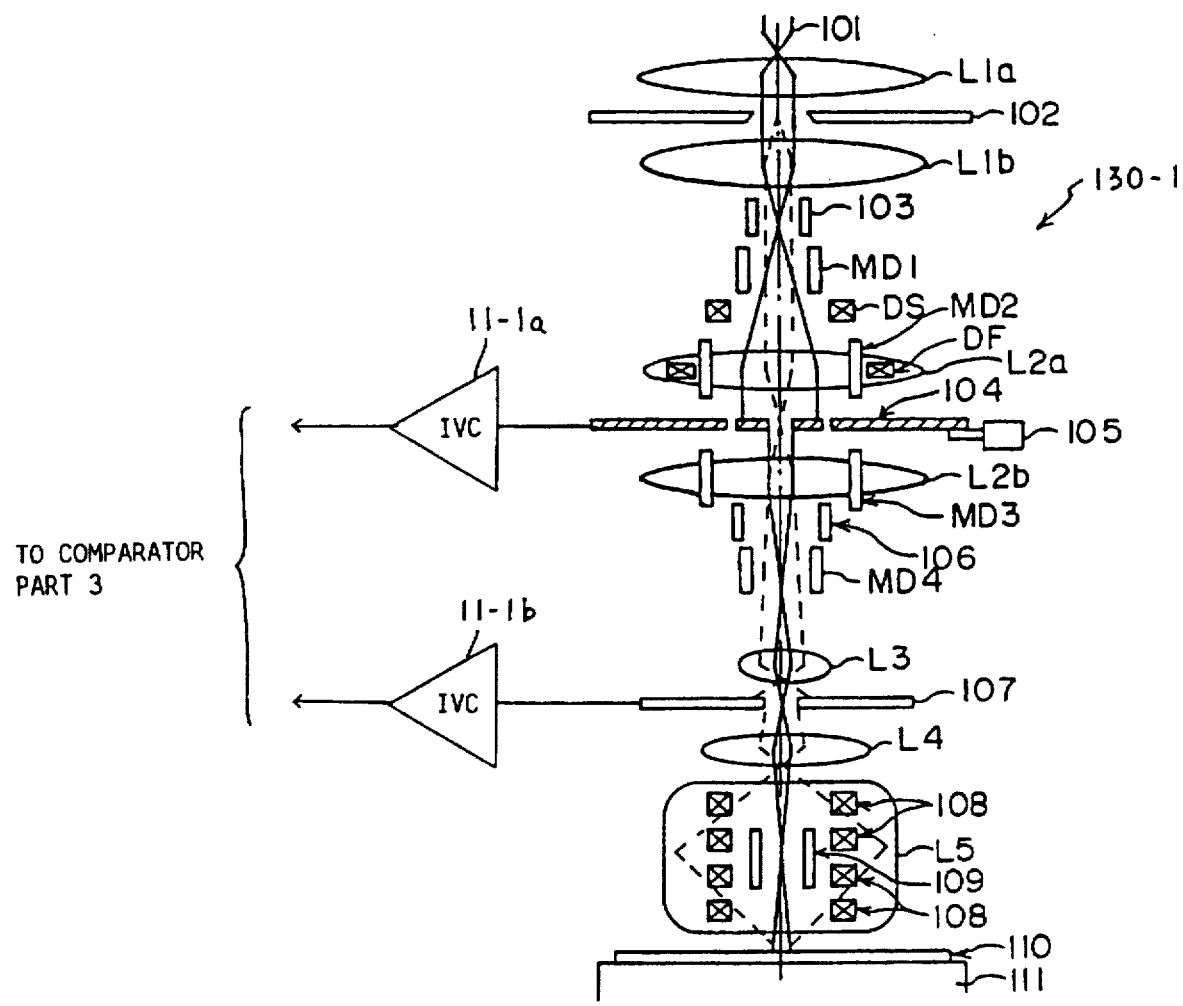
FIG. 7 is a diagram showing an embodiment of an electron beam column.

FIG. 7 is a diagram showing an embodiment of the electron beam column 130-1. In FIG. 7, those parts which are the same as those corresponding parts in FIG. 1 are designated by the same reference numerals, and a description thereof will be omitted.

In FIG. 7, the current value of the circular aperture stop 107 of the column is integrated by an IVC circuit 11-1b, and the data I(1, t) indicative of the current value is supplied to the comparator part 3 shown in FIG. 6. On the other hand, the current value of the block mask 104 is integrated by an IVC circuit 11-1a, and the data I(1, t) indicative of the reflected electron intensity is supplied to the comparator part 3 shown in FIG. 6. Alternatively, it is possible to synthesize the current value and the reflected electron intensity of the circular aperture stop 107, and supply the synthesized value to the comparator part 3 shown in FIG. 6 as the data I(1, t).

Returning now to the description of FIG. 6, the electron beam columns 130-1 and 130-2 expose the same pattern on the corresponding wafers, and thus, the data I(1, t) and I(2, t) must always be the same. However, in actual practice, the data I(1, t) and I(2, t) slightly differ depending on the states of the corresponding electron beam columns 130-1 and 130-2. For this reason, the comparator part 3 supplies an error signal to the CPU 121 via the bus 128 if the error between the data I(1, t) and I(2, t) falls outside a predetermined range.

As a result, the CPU 121 judges that the electron beam exposure apparatus is carrying out a normal operation when no error signal is received from the comparator part 3. On the other hand, if an error signal is received from the comparator part 3, the CPU 121 judges that an abnormality has occurred in the electron beam columns 130-1 and 130-2 or in parts on the upstream side thereof, that is, an abnormality has occurred in a part up to the pattern exposure part, and the CPU 121 issues an alarm. In addition, the CPU 121 manages the generation of the error signal from the comparator part 3, the time when the error signal is generated, the time when the error signal ceased and the like as an error log.

The current values, the reflected electron intensities and the like depend on the states of the electron beam columns 130-1 and 130-2. For this reason, unless the states of the electron beam columns 130-1 and 130-2 are exactly the same, an error exists between the data I(1, t) and I(2, t) output from the IVCs 11-1a and 11-1b depending on the column states. This error between the data I(1, t) and I(2, t) is not zero, but since the arrangements of the deflectors, wafers and the like in the two electron beam columns 130-1 and 130-2 match within a mechanical precision, the error between the pattern data I(1, t) and I(2, t) always fall within a certain range $\delta$. Accordingly, the certain range $\delta$ is determined in the comparator part 3, and the comparator part 3 detects whether $|R \cdot I(1, t) - S \cdot I(2, t) - 0| \leq \delta$ or $|R \cdot I(1, t) - S \cdot I(2, t) - 0| > \delta$ is satisfied, where R and S are parameters for considering the difference between the current densities of the columns. If the former condition is satisfied, the comparator part 3 will not generate an error signal. On the other hand, if the latter condition is satisfied, the comparator part 3 generates an error signal which is then supplied to the CPU 121 via the bus 128.

Figure 8:
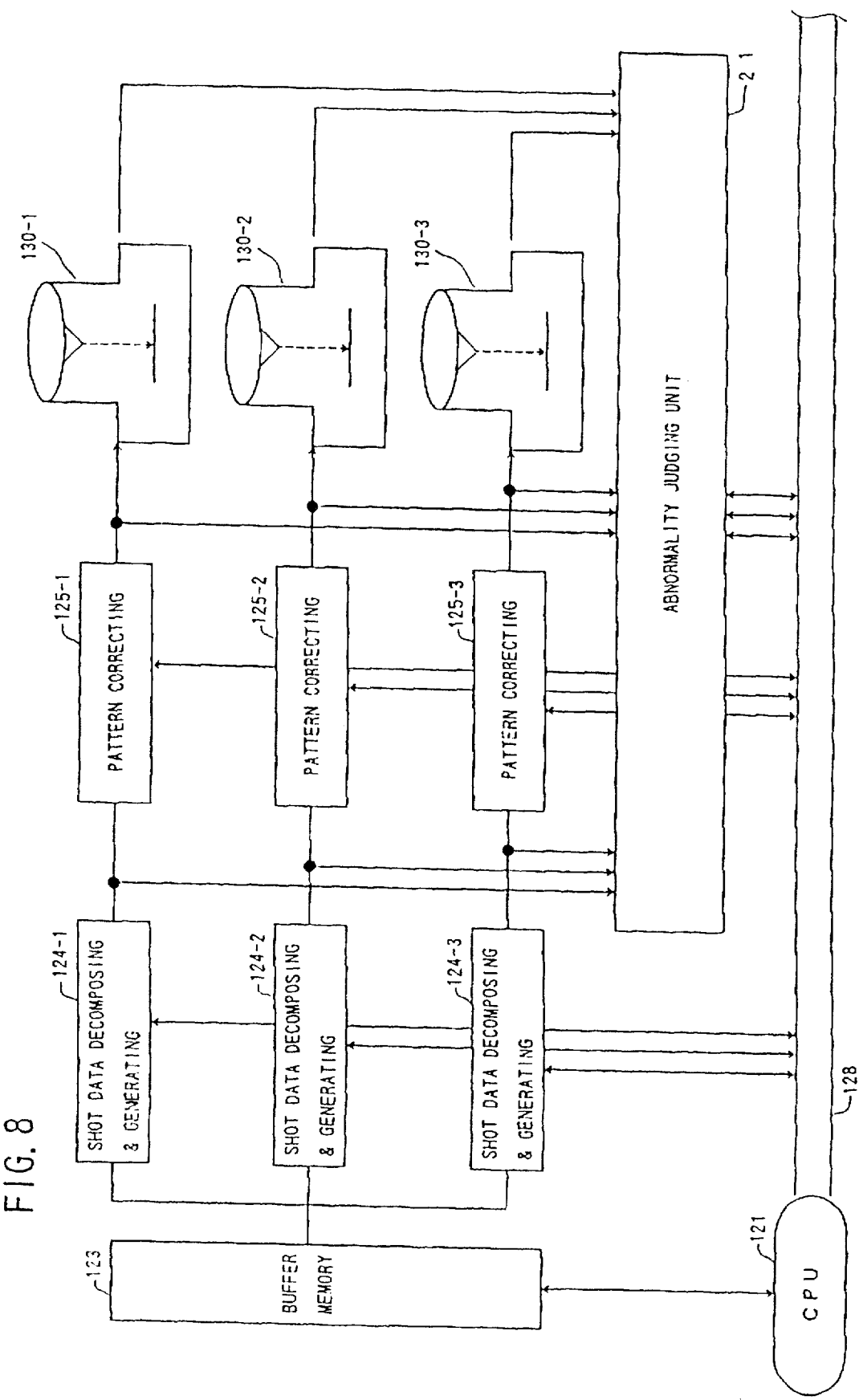
FIG. 8 is a system block diagram showing a part of a second embodiment of the charged particle beam exposure apparatus according to the present invention.

Next, a description will be given of a second embodiment of the charged particle beam exposure apparatus according to the present invention. FIG. 8 is a system block diagram showing a part of the second embodiment. In FIG. 8, those parts which are the same as those corresponding parts in FIG. 3 are designated by the same reference numerals, and a description thereof will be omitted. In this embodiment, the present invention is applied to the electron beam exposure, and this embodiment employs a second embodiment of a charged particle beam exposure method according to the present invention.

In the first embodiment described above, the abnormality of the electron beam exposure apparatus is detected using the data at various parts of the two systems. However, the present invention is of course applicable to the case where three or more systems are provided. In other words, it is possible to detect the abnormality of the electron beam exposure apparatus using the data at various parts of the shot data decomposing and generating parts (pattern generating part), the pattern correcting parts and the electron beam columns which are provided in three or more systems.

In the second embodiment, as an example of a case where more than two systems are provided, the shot data decomposing and generating part (pattern generating part), the pattern correcting part and the electron beam column are respectively provided in three systems. A first system is made up of the shot data decomposing and generating part 124-1, the pattern data correcting part 125-1 and the electron beam column 130-1. A second system is made up of the shot data decomposing and generating part 124-2, the pattern data correcting part 125-2 and the electron beam column 130-2. In addition, a third system is made up of a shot data decomposing and generating part 124-3, a pattern data correcting part 125-3 and an electron beam column 130-3.

An abnormality judging unit 21 compares data D(1, t), D(2, t) and D(3, t) received from the shot data decomposing and generating parts 124-1, 124-2 and 124-3, and judges one of states A1, B1 and C1 satisfied by these data D(1, t), D(2, t) and D(3, t), and notifies the CPU 121 via the bus 128 if necessary. The state A1 indicates that all of the data D(1, t), D(2, t) and D(3, t) match. The state B1 indicates that only one of the data D(1, t), D(2, t) and D(3, t) differs from the other two data. Further, the state C1 indicates that all of the data D(1, t), D(2, t) and D(3, t) are different.

The abnormality judging unit 21 makes no particular notification to the CPU 121 if the state A1 is detected. If the state B1 is detected, the abnormality judging unit 21 notifies error information to the CPU 121, where the error information includes information related to the location of the abnormality, the state of the abnormality, the system number of the system in which the abnormality is detected and the like. For example, if only the data D(1, t) differs from the other two data D(2, t) and D(3, t), the abnormality is generated in the shot data decomposing and generating part 124-1 or in a part on the upstream side thereof, and the state of the abnormality indicates the kind of error, for example, and the system number of the system in which the abnormality is detected is "1" in this case. On the other hand, if the state C1 is detected, the abnormality is generated in the shot data decomposing and generating parts 124-1 through 124-3 or in parts on the upstream sides thereof in at least two or more systems. Hence, if the state C1 is detected, the abnormality judging unit 21 notifies the error information which includes information related to the location of the abnormality, the state of the abnormality, the system number of the system in which the abnormality is detected and the like to the CPU 121.

The abnormality judging unit 21 also compares data G(1, t), G(2, t) and G(3, t) received from the pattern data correcting parts 125-1, 125-2 and 125-3, and judges one of states A2, B2 and C2 satisfied by these data G(1, t), G(2, t) and G(3, t), and notifies the CPU 121 via the bus 128 if necessary. The state A2 indicates that all of the data G(1, t), G(2, t) and G(3, t) fall within a tolerable range. The state B2 indicates that only one of the data G(1, t), G(2, t) and G(3, t) differs from the other two data and falls outside this tolerable range. In addition, the state C2 indicates that all of the data G(1, t), G(2, t) and G(3, t) fall outside this tolerable range.

The abnormality judging unit 21 makes no particular notification to the CPU 121 if the state A2 is detected. If the state B2 is detected, the abnormality judging unit 21 notifies error information to the CPU 121, where the error information includes information related to the location of the abnormality, the state of the abnormality, the system number of the system in which the abnormality is detected and the like. For example, if only the data G(2, t) differs from the other two data G(1, t) and G(3, t), the abnormality is generated in the pattern data correcting part 125-2 or in a part on the upstream side thereof, and the state of the abnormality indicates the kind of error, for example, and the system number of the system in which the abnormality is detected is "2" in this case. On the other hand, if the state C2 is detected, the abnormality is generated in the pattern data correcting parts 125-1 through 125-3 or in parts on the upstream sides thereof in at least two or more systems. Hence, if the state C2 is detected, the abnormality judging unit 21 notifies the error information which includes information related to the location of the abnormality, the state of the abnormality, the system number of the system in which the abnormality is detected and the like to the CPU 121.

The abnormality judging unit 21 also compares data I(1, t), I(2, t) and I(3, t) received from the electron beam columns 130-1, 130-2 and 130-3, and judges one of states A3, B3 and C3 satisfied by these data I(1, t), I(2, t) and I(3, t), and notifies the CPU 121 via the bus 128 if necessary. The state A3 indicates that all of the data I(1, t), I(2, t) and I(3, t) fall within a tolerable range. The state B3 indicates that only one of the data I(1, t), I(2, t) and I(3, t) differs from the other two data and falls outside this tolerable range. In addition, the state C3 indicates that all of the data I(1, t), I(2, t) and I(3, t) fall outside this tolerable range.

The abnormality judging unit 21 makes no particular notification to the CPU 121 if the state A3 is detected. If the state B3 is detected, the abnormality judging unit 21 notifies error information to the CPU 121, where the error information includes information related to the location of the abnormality, the state of the abnormality, the system number of the system in which the abnormality is detected and the like. For example, if only the data I(3, t) differs from the other two data I(1, t) and I(2, t), the abnormality is generated in the electron beam column 130-3 or in a part on the upstream side thereof, and the state of the abnormality indicates the kind of error, for example, and the system number of the system in which the abnormality is detected is "3" in this case. On the other hand, if the state C3 is detected, the abnormality is generated in the electron beam columns 130-1 through 130-3 or in parts on the upstream sides thereof in at least two or more systems. Hence, if the state C3 is detected, the abnormality judging unit 21 notifies the error information which includes information related to the location of the abnormality, the state of the abnormality, the system number of the system in which the abnormality is detected and the like to the CPU 121.

Figure 9:
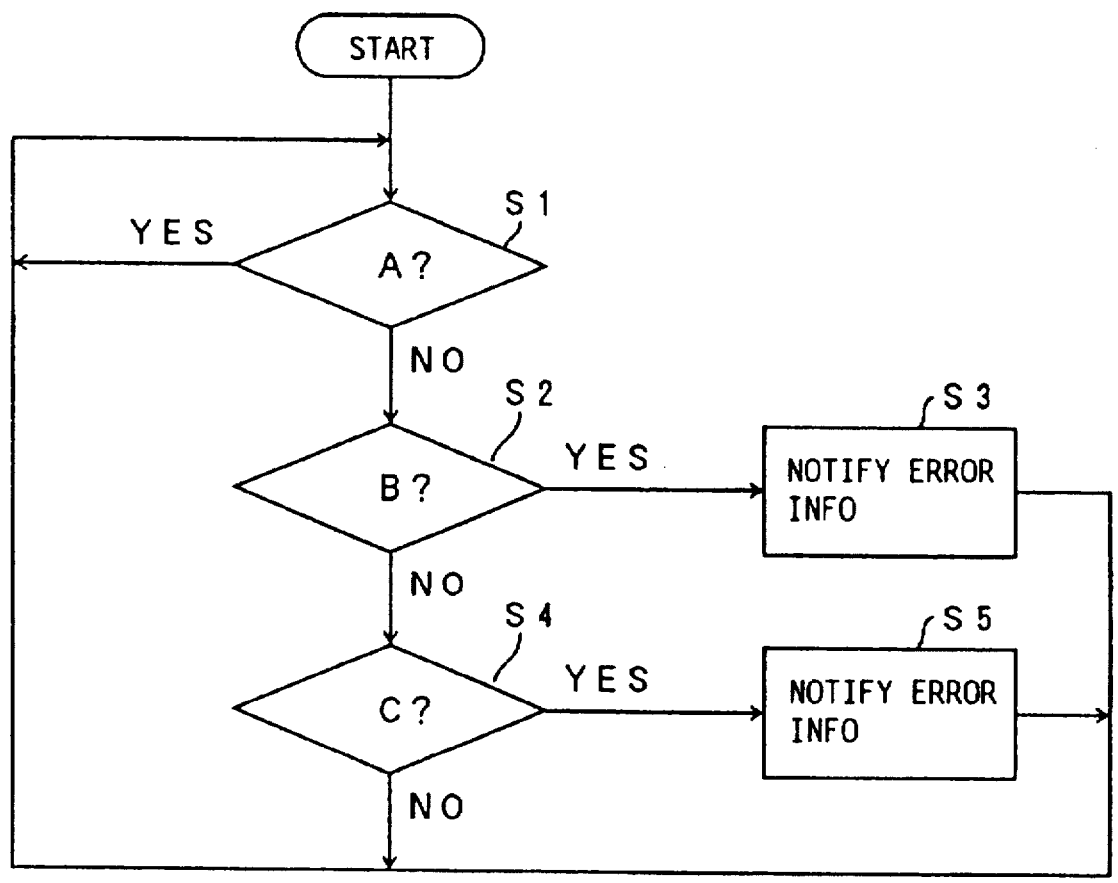
FIG. 9 is a flow chart for explaining the operation of an abnormality judging unit.

FIG. 9 is a flow chart for explaining the operation of the abnormality judging unit 21. In FIG. 9, a step S1 decides whether or not the state A (A1, A2 or A3) is detected, and the process advances to a step S2 if the decision result in the step S1 becomes NO. The step S2 decides whether or not the state B (B1, B2 or B3) is detected, and if the decision result in the step S2 is YES, a step S3 notifies the error information which includes information related to the location of the abnormality, the state of the abnormality, the system number of the system in which the abnormality is detected and the like to the CPU 121. On the other hand, if the decision result in the step S2 is NO, a step S4 decides whether or not the state C (C1, C2 or C3) is detected. If the decision result in the step S4 is YES, the abnormality is generated in at least two or more systems, and thus, a step S5 notifies the error information which includes information related to the location of the abnormality, the state of the abnormality, the system number of the system in which the abnormality is detected and the like to the CPU 121 in order to indicate the detected state C. The process returns to the step S1 after the steps S3 and S5 or, if the decision result in the step S4 is NO.

The above described process shown in FIG. 9 is carried out with respect to each of the output data D(1, t) through D(3, t) of the shot data decomposing and generating parts 124-1 through 124-3, the output data G(1, t) through G(3, t) of the pattern data correcting parts 125-1 through 125-3, and the output data I(1, t) through I(3, t) of the electron beam columns 130-1 through 130-3. Of course, it is possible to carry out the process shown in FIG. 9 with respect to the output data from the three systems at parts other than the above.

Figure 10:
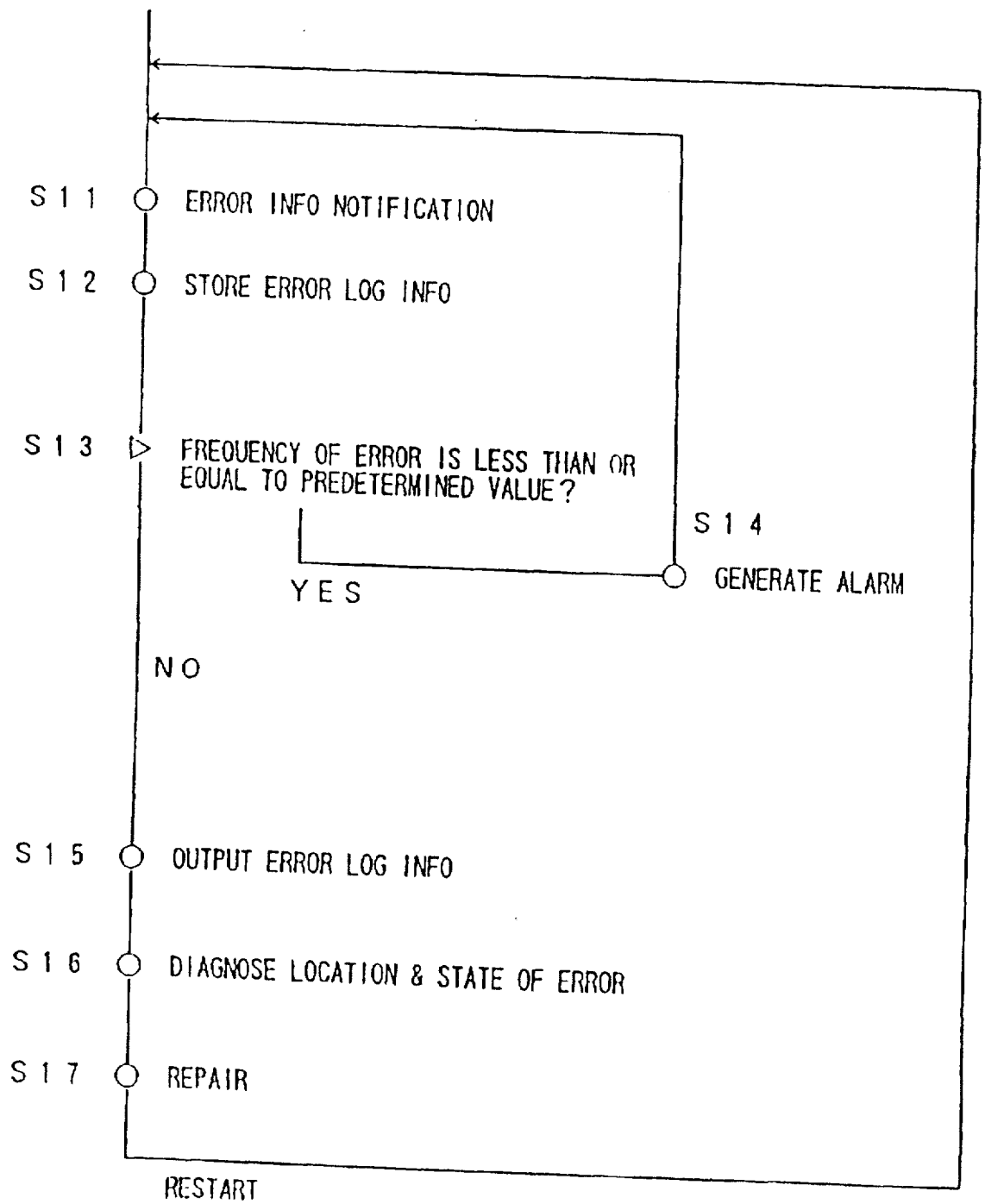
FIG. 10 is a flow chart for explaining an embodiment of the operation of a CPU.

FIG. 10 is a flow chart for explaining an embodiment of the operation of the CPU 121. The operation of the CPU 121 shown in FIG. 10 is applicable to both the first and second embodiments described above.

In FIG. 10, the error process of the CPU 121 is started by a step S11 when the error information notification is received from the comparator parts 1 through 3 or the abnormality judging unit 21. A step S12 stores error log information in the memory 129 of the CPU 121 shown in FIG. 1 based on the error information notification. As described above, the error log information includes the location of the error (abnormality), the state of the error (abnormality), the system number of the system in which the error (abnormality) is detected and the like. The error log information is stored in the memory 129 in a file format. A step S13 decides whether or not the frequency of the errors which may be judged as being generated by the same cause is less than or equal to a predetermined value. If the decision result in the step S13 is YES, a step S14 generates an alarm. The alarm may be generated in various form. For example, the alarm may be generated by making an error marking on the wafer which is subjected to the exposure process or, the alarm may be written in an exposure state management file which is stored in the memory 129 or the like and is managed by the CPU 121. The process returns to the step S11 after the step S14.

On the other hand, if the decision result in the step S13 is NO, a step S15 outputs the error log information. For example, the error log information may be output by displaying the error log information or printing the error log information. Based on the output error log information, the operator more strictly specifies the location where the error is generated and diagnoses the error state in a step S16. In a step S17, one or more necessary parts of the electron beam exposure apparatus are repaired by the operator or a serviceman, so as to remove the abnormality. After the step S17, the process returns to the step S11 and the process is restarted.

The reference that is used for the judgement in the comparator parts and the abnormality judging unit when determining the error signal generation by comparing the data such as the corrected pattern data, the current values or the reflected electron intensities which are obtained from two or more system is of course not limited to those of the embodiments described above.

As a first modification of the judging reference, it is possible to employ a method of comparing an absolute value $|P_d \cdot DD_i - Q_d \cdot DD_j| - |O_d|$ and an evaluation value $\delta_d$ by using data $DD_i$ from a system i and data $DD_j$ from a system j, where $P_d$, $Q_d$ and $O_d$ denote parameters. In this case, the error notification is made to the CPU 121 when the absolute value is greater than the evaluation value $\delta_d$.

In addition, as a second modification of the judging reference, it is possible to employ a method of comparing an absolute value $|P_d \cdot DD_i - Q_d \cdot DD_j| - |R_d \cdot \delta DD_i|$ and the evaluation value $\delta_d$ by using the data $DD_i$ from the system i, a deviation $\delta DD_i$ of the data $DD_i$ from the system i during 1 clock period, and the data $DD_j$ from the system j, where $P_d$, $Q_d$ and $R_d$ denote parameters. In this case, the error notification is made to the CPU 121 when the absolute value is greater than the evaluation value $\delta_d$. In other words, the error notification is made to the CPU 121 only when the difference between the data $DD_i$ from the system i and the data $DD_j$ from the system j becomes greater than a jumping amount of each data for each clock.

Furthermore, as a third modification of the judging reference, it is possible to determine whether or not a condition $|_\Delta DD_i - _\Delta DD_j| \geq E \cdot _\Delta DD_m$ is satisfied by using a jumping quantity $_\Delta DD_i = DD_i(new) - DD_i(old)$ of the data $DD_i$ from the system i for every shot, a jumping quantity $_\Delta DD_j = DD_j(new) - DD_j(old)$ of the data $DD_j$ of the system j for every shot, and $_\Delta DD_m = max(|_\Delta DD_i|, |_\Delta DD_j|)$, where E denotes a parameter and $_\Delta DD_m$ denotes a largest one of the jumping quantities $|_\Delta DD_i|$ and $|_\Delta DD_j|$ within a range in which the data $DD_i$ and $DD_j$ change while a pattern is exposed. Actually, while a pattern is exposed, $|_\Delta DD_i|$ and $|_\Delta DD_j|$ are approximately constant and correspond to the data jumping quantity between the shots. In this case, the error notification is made to the CPU 121 when the above condition is satisfied. On the other hand, no error notification is made to the CPU 121 if $|_\Delta DD_i - _\Delta DD_j| < E \cdot _\Delta DD_m$ is satisfied.

Figure 11:
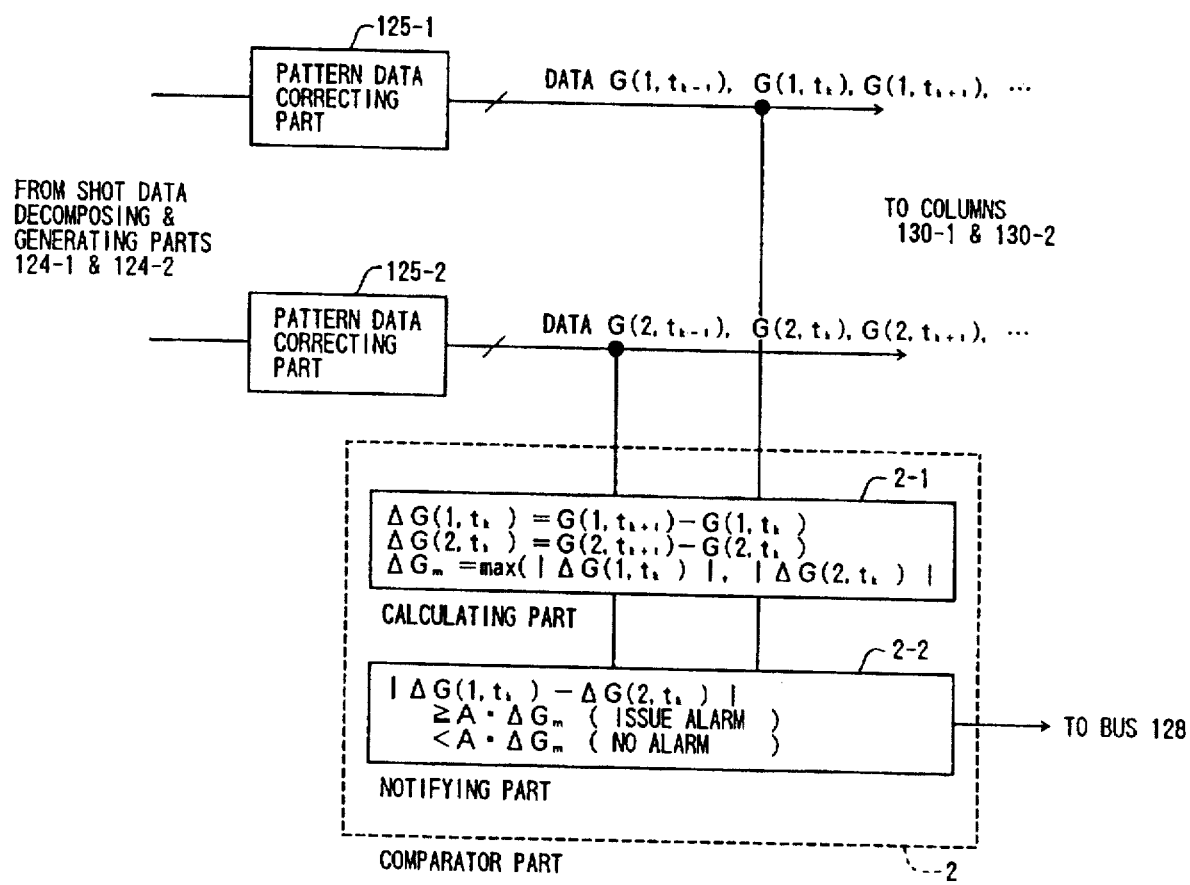
FIG. 11 is a system block diagram showing another embodiment of the data comparator part which makes a comparison after pattern data correction.

FIG. 11 is a system block diagram showing another embodiment of the data comparator part which makes a comparison after the pattern data correction and employs the third modification of the judging reference described above. In FIG. 11, those parts which are the same as those corresponding parts in FIG. 3 are designated by the same reference numerals, and a description thereof will be omitted.

In FIG. 11, the pattern data correcting parts 125-1 and 125-2 simultaneously receive the same shot data from the shot data decomposing and generating parts 124-1 and 124-2, and respectively correct the shot data into pattern data $G(1, t_{k-1})$, $G(1, t_k)$, $G(1, t_{k+1})$, ... and pattern data $G(2, t_{k-1})$, $G(2, t_k)$, $G(2, t_{k+1})$, ... by assigning numbers 1 and 2 to the two systems and representing the time by t.

The electron beam columns 130-1 and 130-2 expose the same pattern on the corresponding wafers, and thus, the pattern data $G(1, t_{k-1})$, $G(1, t_k)$, $G(1, t_{k+1})$, ... and the pattern data $G(2, t_{k-1})$, $G(2, t_k)$, $G(2, t_{k+1})$, ... must always match. However, in actual practice, the pattern data $G(1, t_{k-1})$, $G(1, t_k)$, $G(1, t_{k+1})$, ... and the pattern data $G(2, t_{k-1})$, $G(2, t_k)$, $G(2, t_{k+1})$, ... slightly differ depending on the states of the corresponding electron beam columns 130-1 and 130-2. For this reason, the comparator part 2 supplies an error signal to the CPU 121 via the bus 128 when the error between the pattern data $G(1, t_{k-1})$, $G(1, t_k)$, $G(1, t_{k+1})$, ... and the pattern data $G(2, t_{k-1})$, $G(2, t_k)$, $G(2, t_{k+1})$, ... falls outside a predetermined range.

The CPU 121 judges that the electron beam exposure apparatus is carrying out a normal operation if no error signal is received from the comparator part 2. On the other hand, when an error signal is received from the comparator part 2, the CPU 121 judges that an abnormality has occurred in the pattern data correcting parts 125-1 and 125-2 or in parts on the upstream side thereof, that is, an abnormality has occurred in a part up to the pattern correcting part of the electron beam exposure apparatus, and issues an alarm. In addition, the CPU 121 manages the generation of the error signal from the comparator part 2, the time when the error signal is generated, the time when the error signal ceased and the like as an error log.

The pattern data correcting parts 125-1 and 125-2 carry out correcting operations dependent on the states of the electron beam columns 130-1 and 130-2. Hence, unless the electron beam columns 130-1 and 130-2 are exactly in the same state, an error will exist between the pattern data $G(1, t_{k-1})$, $G(1, t_k)$, $G(1, t_{k+1})$, ... and the pattern data $G(2, t_{k-1})$, $G(2, t_k)$, $G(2, t_{k+1})$, ... output from the pattern data correcting parts 125-1 and 125-2 depending on the column states. This error is not zero, but since the arrangements of the deflectors, wafers and the like in the two electron beam columns 130-1 and 130-2 match within a mechanical precision, the error between the pattern data $G(1, t_{k-1})$, $G(1, t_k)$, $G(1, t_{k+1})$, ... and the pattern data $G(2, t_{k-1})$, $G(2, t_k)$, $G(2, t_{k+1})$, ... is considerably small compared to the correction quantity.

The comparator part 2 includes a calculating part 2-1 and a notifying part 2-2. The calculating part 2-1 calculates $_\Delta G_m = \max(|_\Delta G(1, t_k)|, |_\Delta G(2, t_k)|)$ from a jumping quantity $_\Delta G(1, t_k) = G(1, t_{k+})-G(1, t_k)$ from the system 1 for every shot of the data $G(1, t_k)$ and a jumping quantity $_\Delta G(2, t_k) = G(2, t_{k+1})-G(2, t_k)$ from the system 2 for every shot of the data $G(2, t_k)$, where $_\Delta G_m$ denotes a largest one of the jumping quantities $|_\Delta G(1, t_k)|$ and $|_\Delta G(2, t_k)|$ within a range in which the data $G(1, t_k)$ and $G(2, t_k)$ change while a pattern is exposed. On the other hand, the notifying part 2-2 judges whether a relationship $|_\Delta G(1, t_k)-_\Delta G(2, t_k)| \geq E \cdot _\Delta G_m$ or a relationship $|_\Delta G(1, t_k)-_\Delta G(2, t_k)| < E \cdot _\Delta G_m$ is satisfied, where E denotes a parameter. The notifying part 2-2 makes an error notification to the CPU 121 if the former relationship is satisfied.

Therefore, by providing 2 or more exposure systems and comparing the digital data, current values, reflected electron intensities and the like between the exposure systems at various parts of the electron beam exposure apparatus, it is possible to carry out the operations of detecting the abnormality and specifying the location of the abnormality in the electron beam exposure apparatus while the electron beam exposure apparatus is operating, without affecting the exposure operation. For this reason, the failure analysis is facilitated. In addition, the exposure throughput of the electron beam exposure apparatus will not deteriorate because the operations of detecting the abnormality and specifying the location of the abnormality in the electron beam exposure apparatus are carried out during operation of the electron beam exposure apparatus. If N exposure systems are provided, where N denotes a positive integer, the exposure throughput becomes N times that of the cases where one exposure system is provided.

In each of the embodiments described above, it was assumed for the sake of convenience that the wafers are mounted on a single wafer stage. However, it is of course possible to provide one wafer stage and one stage driving part with respect to each of the electron beam columns, that is, with respect to each wafer.

But if the wafer stages in a plurality of systems are driven simultaneously, the electron beam columns may sway due to the shocks caused by the acceleration motions of the wafer stages at each returning point of moving loci of the wafer stages. In addition, since the wafer stages are accelerated and decelerated depending on whether the patterns to be exposed are coarse or dense, the electron beam columns may also sway due to the shocks caused by such accelerations and decelerations of the wafer stages. Furthermore, the center of gravity of each electron beam column moves as the corresponding wafer stage moves, and the electron beam columns may also sway due to the movements of the centers of gravity thereof. If the electron beam column sways, the irradiating position of the electron beam on the wafer will not stabilize, and there is a possibility that the precision of the exposed pattern will deteriorate.

Accordingly, a description will be given of an embodiment which can positively prevent swaying of the electron beam column.

Figure 12:
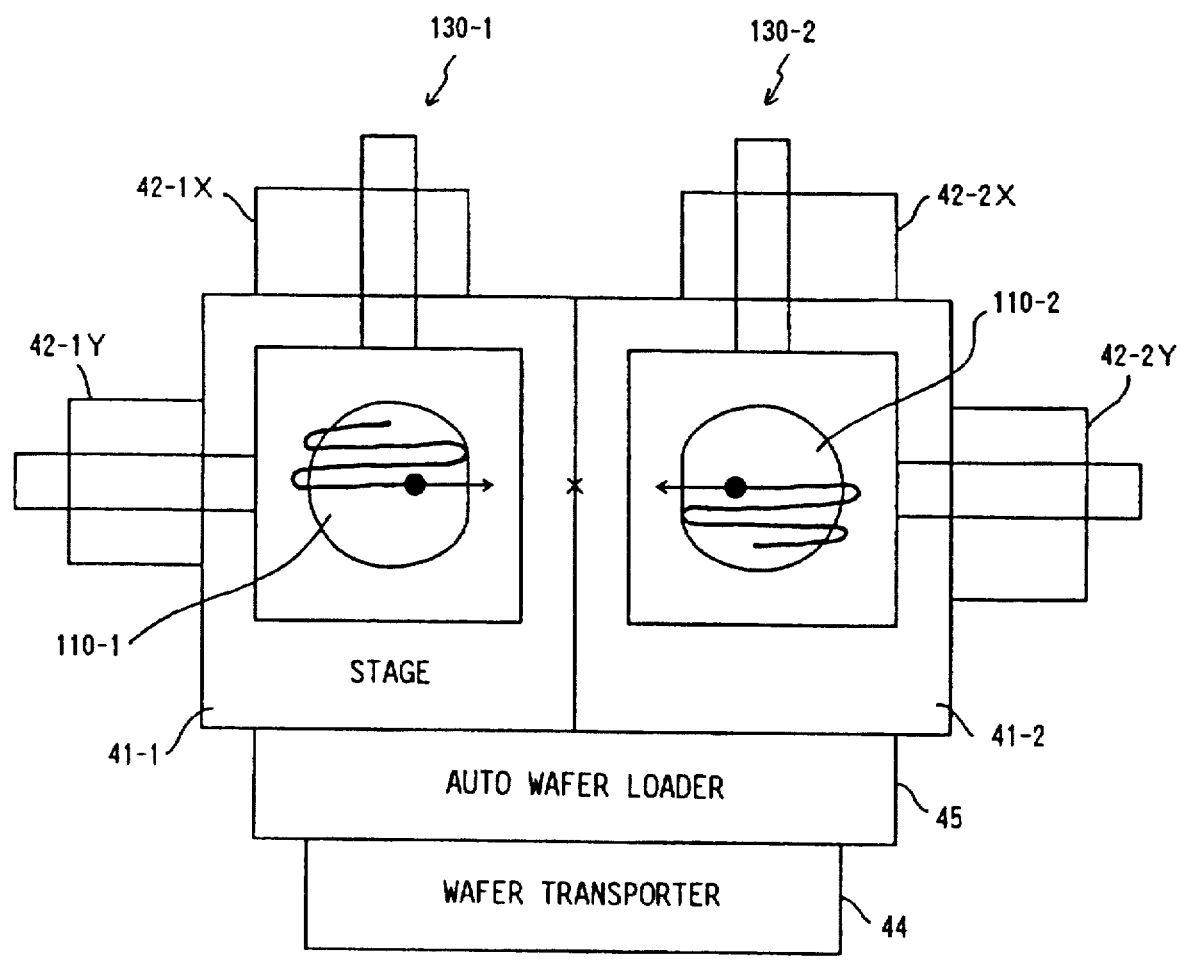
FIG. 12 is a plan view showing a part of a third embodiment of the charged particle beam exposure apparatus according to the present invention.

FIG. 12 is a plan view showing a part of a third embodiment of the charged particle beam exposure apparatus according to the present invention. In this embodiment, the present invention is applied to the electron beam exposure, and this embodiment employs a third embodiment of the charged particle beam exposure method according to the present invention.

In FIG. 12, a wafer 110-1 is mounted on a wafer stage 41-1, and the wafer stage 41-1 is moved in directions X and Y by corresponding X-driving part 42-1X and Y-driving part 42-1Y. A wafer 110-2 is mounted on a wafer stage 41-2, and the wafer stage 41-2 is moved in the directions X and Y by corresponding X-driving part 42-2X and Y-driving part 42-2Y. An automatic wafer loader 45 automatically loads the wafers which are transported by a wafer transporter 44 onto the wafer stages 41-1 and 41-2. Known means may be used for the automatic wafer loader 45 and the wafer transporter 44. For example, the wafer stage 41-1 is a part of the electron beam column 130-1 of the first embodiment described above, and the wafer stage 41-2 is a part of the electron beam column 130-2 of the first embodiment. In FIG. 12, black circular marks respectively indicate center axes of the electron beam columns 130-1 and 130-2.

In this embodiment, the same pattern is exposed on the wafers 110-1 and 110-2. However, the scanning loci of the electron beams on the wafers 110-1 and 110-2 and the moving loci of the wafer stages 41-1 and 41-2 are set point-symmetrical with reference to a point "x" shown in FIG. 12. The wafer stages 41-1 and 41-2, the X-driving parts 42-1X and 42-2X, the Y-driving parts 42-1Y and 42-2Y, and the wafers 110-1 and 110-2 are arranged as shown in FIG. 12 in order to realize such symmetrical electron scanning loci and stage moving loci.

Accordingly, the wafer stages 41-1 and 41-2 move while counter-balancing each other. For this reason, the shock applied to the electron beam column 130-1 due to the acceleration movement of the wafer stage 41-1 at the returning point of the moving locus of the wafer stage 41-1 and the shock applied to the electron beam column 130-2 due to the acceleration movement of the wafer stage 41-2 at the returning point of the moving locus of the wafer stage 41-2 cancel each other. In addition, even when the wafer stages 41-1 and 41-2 are accelerated and decelerated depending on whether or not the patterns to be exposed are coarse or dense, the shocks applied to the electron beam columns 130-1 and 130-2 due to the acceleration and deceleration are mutually cancelled. Furthermore, even when the wafer stages 41-1 and 41-2 move, the center of gravity of the apparatus as a whole comprising the electron beam columns 130-1 and 130-2 will not move. Therefore, according to this embodiment, it is possible to positively prevent the electron beam columns 130-1 and 130-2 from swaying. As a result, the precision of the exposed patterns will not deteriorate because the instability of the irradiating positions of the electron beams on the wafers 110-1 and 110-2 is prevented.

Figure 13:
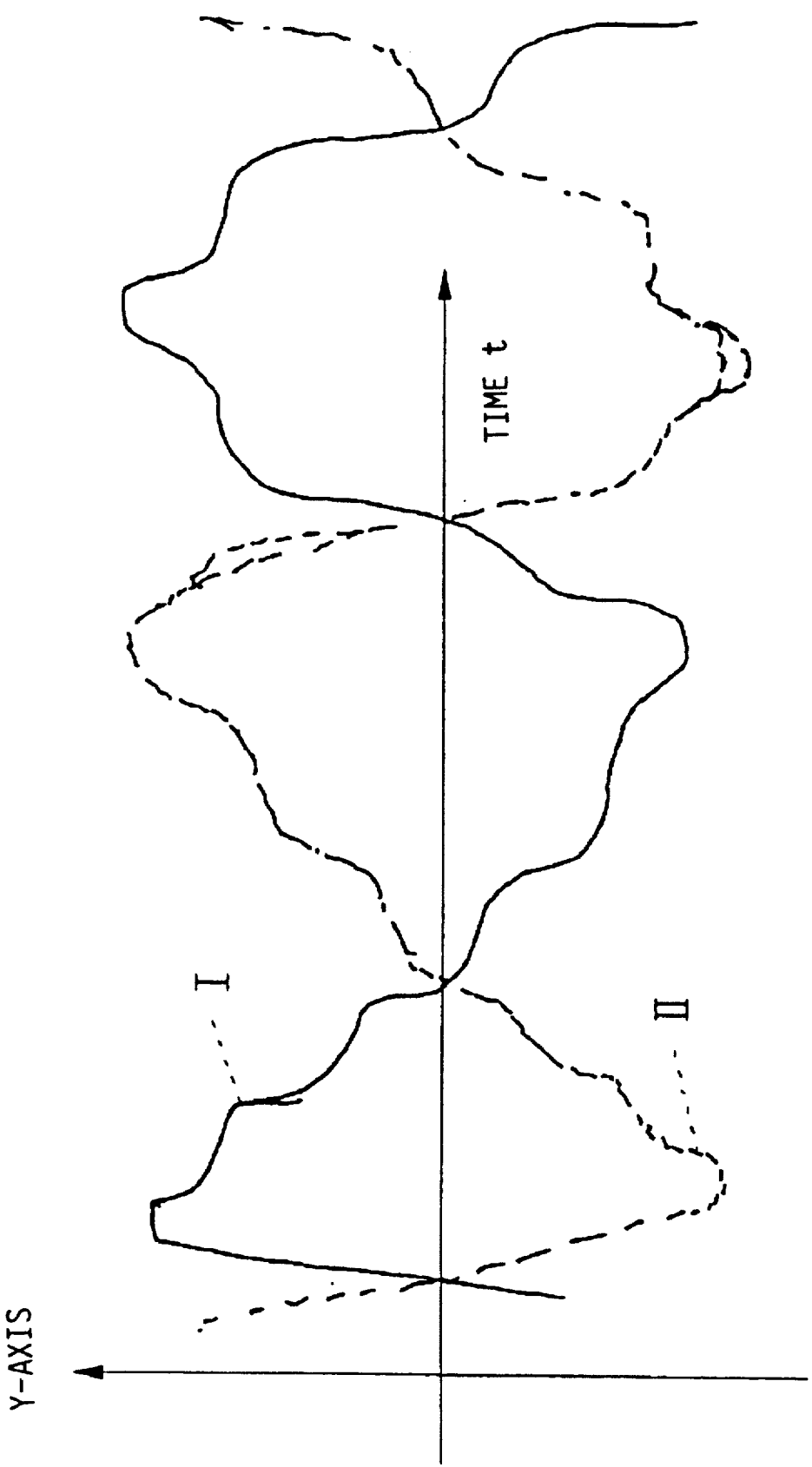
FIG. 13 is a diagram showing a moving locus of a wafer stage.

FIG. 13 is a diagram showing moving loci I and II of the wafer stages 41-1 and 41-2. In FIG. 13, the ordinate indicates the displacement of the wafer stage in the direction Y, and the abscissa indicates the time. As may be seen from FIG. 13, the above described counter-balance is maintained because the wafer stages 41-1 and 41-2 move symmetrically to each other.

The number of wafer stages used is of course not limited to two. Basically, it is possible to provide two or more wafer stages as long as the center of gravity of the apparatus as a whole comprising a plurality of electron beam columns does not move even when each of the wafer stages moves. When the easy arrangement of the parts are taken into consideration, it is preferable to set the number of wafer stages used to 2M, where M is a positive integer.

Figure 14:
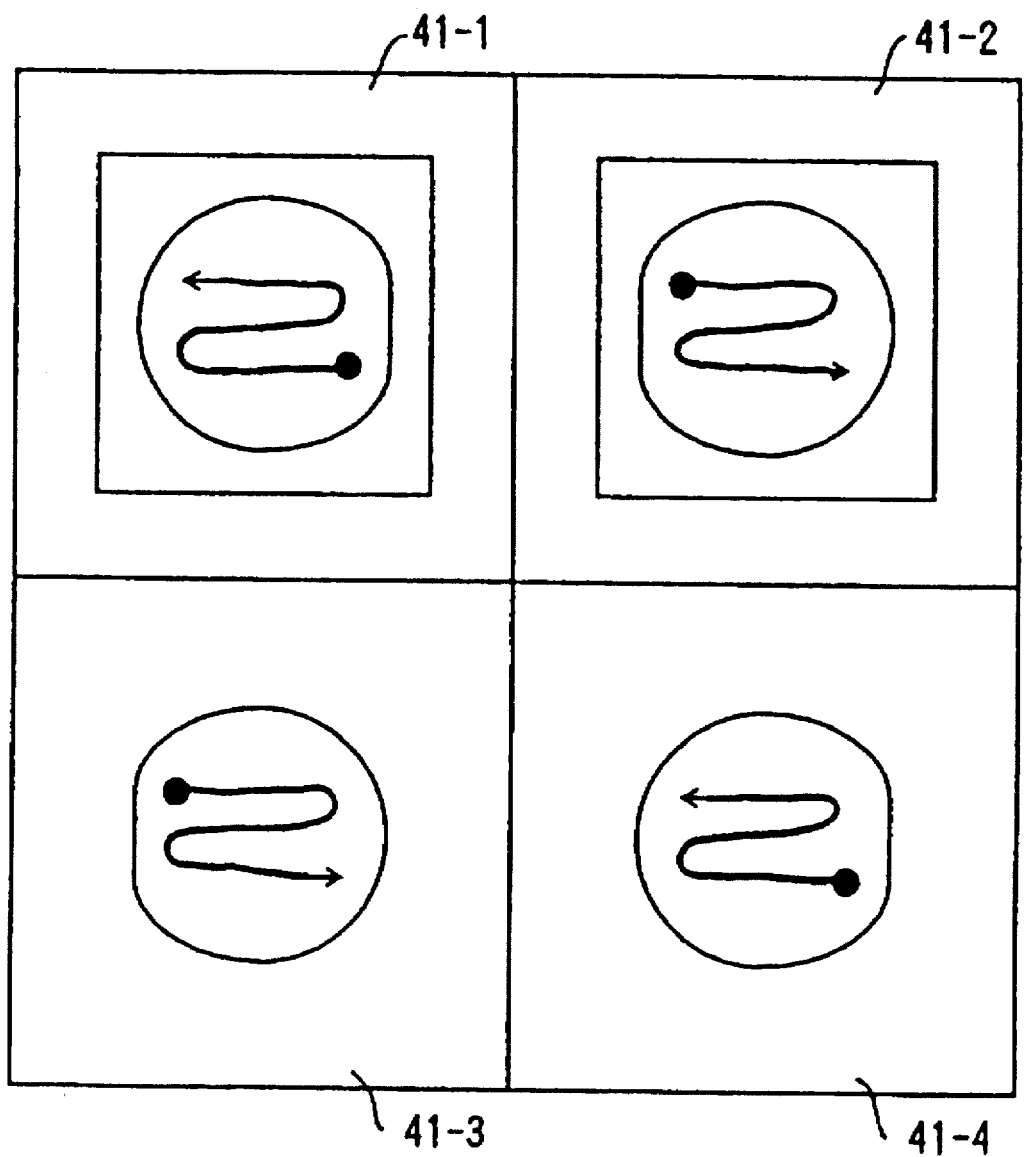
FIG. 14 is a diagram schematically showing an arrangement of four wafer stages and moving loci thereof.
Figure 15:
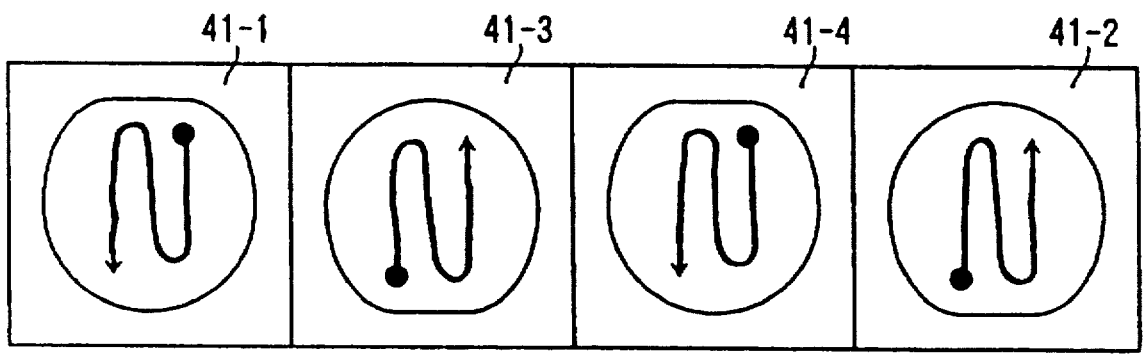
FIG. 15 is a diagram schematically showing another arrangement of four wafer stages and moving loci thereof.

FIGS. 14 and 15 respectively are diagrams schematically showing the arrangement and moving loci of the wafer stages when four wafer stages are provided.

In the case shown in FIG. 14, the top two wafer stages 41-1 and 41-2 move while counter-balancing each other, and the bottom two wafer stages 41-3 and 41-4 move while counter-balancing each other. Alternatively, it is possible to take measures so that the 2 diagonally provided wafer stages 41-1 and 41-4 may move while counter-balancing each other, and the other 2 diagonally provided wafer stages 41-2 and 41-3 move while counter-balancing each other.

In the case shown in FIG. 15, the two end wafer stages 41-1 and 41-2 move while counter-balancing each other, and the middle two wafer stages 41-3 and 41-4 move while counter-balancing each other. Alternatively, it is possible to take measures so that the two left wafer stages 41-1 and 41-3 move while counter-balancing each other, and the two right wafer stages 41-2 and 41-4 move while counter-balancing each other.

In each of the embodiments described above, the present invention is applied to the electron beam exposure. However, the present invention is of course applicable to any type of charged particle beam exposure.

Further, the present invention is not limited to these embodiments, but various variations and modifications may be made without departing from the scope of the present invention.

What is claimed is:

1. A charged particle beam exposure method for use with an exposure apparatus which includes a plurality of exposure systems that simultaneously expose the same pattern, comprising:

(a) generating, by a pattern generating unit in each exposure system, data related to patterns which are to be exposed;

(b) deflecting, by a column unit in each exposure system, a charged particle beam onto an object which is mounted on a stage by deflecting the charged particle beam based on the data generated by the pattern generating unit in a corresponding exposure system; and (c) detecting an abnormality in the exposure apparatus during operation of the exposure apparatus based on (i) a comparison of outputs of corresponding shot data decomposing or generating parts in each of the columns, (ii) a comparison of outputs of corresponding pattern data correcting parts in each of the columns, or (iii) a comparison of current values or reflected electron intensities of each of the columns.

2. The charged particle beam exposure method as claimed in claim 1, which further comprises the step of:

(d) notifying error information to a host unit based on the data which are obtained from the corresponding parts of the exposure systems, said error information at least including a location where the abnormality is generated, a state of the abnormality and a system number of an exposure system in which the abnormality is detected.

3. The charged particle beam exposure method as claimed in claim 2, wherein:

said step (c) determines a certain threshold value g and detects whether $|P \cdot G(i, t) - Q \cdot G(j, t) - O| \leq g$ or $|P \cdot G(i, t) - Q \cdot G(j, t) - O| > g$ is satisfied, where $G(i, t)$ and $G(j, t)$ denote data which are obtained by correcting the pattern data generated by the pattern generating unit in two exposure systems, t denotes time, P, Q and C are parameters for considering differences between states of the column units, and where i and j are identifiers for the charged particle beam exposure systems; and said step (d) generates no error signal if $|P \cdot G(i, t) - Q \cdot G(j, t) - O| \leq g$ is satisfied and generates an error signal and notifies the abnormality to the host unit if $|P \cdot G(i, t) - Q \cdot G(j, t) - O| > g$ is satisfied.

4. The charged particle beam exposure method as claimed in claim 2, wherein:

said step (c) determines a certain range δ and detects whether $|R \cdot I(i, t) - S \cdot I(j, t) - O| \leq \delta$ or $|R \cdot I(i, t) - S \cdot I(j, t) - O| \geq \delta$ is satisfied, where $I(i, t)$ and $I(j, t)$ denote data related to current values at aperture stop parts or reflected charged particle beam intensities at wafer stage parts within the column units of two exposure systems, t denotes time, O, R and S are parameters for considering differences between the current densities of the column units, and i and j are identifiers for the charged particle beam exposure systems; and said step (d) generates no error signal if $|R \cdot I(i, t) - S \cdot I(j, t) - O| \leq \delta$ is satisfied and generates an error signal and notifies the abnormality to the host unit if $|R \cdot I(i, t) - S \cdot I(j, t) - O| > \delta$ is satisfied.

5. The charged particle beam exposure method as claimed in claim 2, wherein:

said step (c) compares an absolute value $||P_d \cdot DD_i - Q_d \cdot DD_j| - |O_d||$ and an evaluation value $\delta_d$ by using data $DD_i$ from an exposure system i and data $DD_j$ from an exposure system j, where $P_d$, $Q_d$ and $O_d$ denote parameters; and said step (d) generates an error signal and notifies the abnormality to the host unit if the absolute value is greater than the evaluation value $\delta_d$.

6. The charged particle beam exposure method as claimed in claim 2, wherein:

said step (c) compares an absolute value $|| P_d \cdot DD_i - Q_d \cdot DD_j| - |R_d \cdot \delta DD_i||$ and an evaluation value $\delta_d$ by using data $DD_i$ from an exposure system i, a deviation $\delta DD_i$ of the data $DD_i$ from the exposure system i during one clock period, and data $DD_j$ from an exposure system j, where $P_d$, $Q_d$ and $R_d$ denote parameters; and said step (d) generates an error signal and notifies the abnormality to the host unit if the absolute value is greater than the evaluation value $\delta_d$.

7. The charged particle beam exposure method as claimed in claim 2, wherein:

said step (c) decides whether or not a condition $|_\Delta DD_i - _\Delta DD_j| \geq E \cdot _\Delta DD_m$ is satisfied by using a jumping quantity $_\Delta DD_i = DD_i(new) - DD_i(old)$ of data $DD_i$ from an exposure system i for every shot, a jumping quantity $_\Delta DD_j = DD_j(new) - DD_j(old)$ of data $DD_j$ of an exposure system j for every shot, and $_\Delta DD_m = max(|_\Delta DD_i|, |_\Delta DD_j|)$, where E denotes a parameter and $_\Delta DD_m$ denotes a largest one of the jumping quantities $|_\Delta DD_i|$ and $|_\Delta DD_j|$ within a range in which the data $DD_i$ and $DD_j$ change while a pattern is exposed; and said step (d) generates an error signal and notifies the abnormality to the host unit if the condition $|_\Delta DD_i - _\Delta DD_j| \geq E \cdot _\Delta DD_m$ is satisfied.

8. The charged particle beam exposure method as claimed in claim 2, wherein said error information further includes a time when the abnormality is generated, and which further comprises the step of:

(e) storing a log of the abnormality based on the notified error information.

9. The charged particle beam exposure method as claimed in claim 1, wherein the data which are obtained from the corresponding parts of the exposure systems are at least one kind of data selected from the group consisting of pattern data generated in the pattern generating unit of each of the exposure systems, data which are obtained by correcting the pattern data by a pattern correcting unit in the pattern generating unit of each of the exposure systems, data related to current values at aperture stop parts within the column unit of each of the exposure systems, and data related to reflected charged particle beam intensities at wafer stage parts within the column unit of each of the exposure systems.

10. The charged particle beam exposure method as claimed in claim 1, wherein said step (c) detects the abnormality if the data obtained from the corresponding parts of at least two exposure systems do not match or an error between the data obtained from the corresponding parts of the at least two exposure systems is outside a tolerable range.

11. The charged particle beam exposure method as claimed in claim 1, wherein the column units of the exposure systems respectively have objects mounted on independent stages, and which further comprises the step of:

(d) moving the stages so as to counter-balance each other.

12. A charged particle beam exposure apparatus comprising:

a plurality of exposure systems which simultaneously expose the same pattern, each of said exposure systems comprising:

a pattern generating unit to generate data related to patterns which are to be exposed; and a column unit to deflect a charged particle beam onto an object which is mounted on a stage by deflecting the charged particle beam based on the data generated by the pattern generating unit in a corresponding exposure system; and a detecting unit for detecting an abnormality in the charged particle beam exposure apparatus during operation of the charged particle beam exposure apparatus based on (i) a comparison of outputs of corresponding shot data decomposing or generating parts in each of the columns, (ii) a comparison of outputs of corresponding pattern data correcting parts in each of the columns, or (iii) a comparison of current values or reflected electron intensities of each of the columns, wherein said detecting unit includes a comparator that compares said corresponding data obtained from said corresponding parts of the exposure systems selected from the group consisting of: corresponding shot data decomposing and generating parts of each of the column means, corresponding pattern data correcting parts in each of the column means, and corresponding column means, and wherein said detecting unit detects the abnormality in the charged particle beam exposure apparatus during operation of the charged particle beam exposure apparatus based on a comparison made by said comparator.

13. The charged particle beam exposure apparatus as claimed in claim 12, which is coupled to a host unit and further comprises:

a notifying unit to notify error information to the host unit based on the data which are obtained from the corresponding parts of the exposure systems, said error information at least including a location where the abnormality is generated, a state of the abnormality and a system number of an exposure system in which the abnormality is detected.

14. The charged particle beam exposure apparatus as claimed in claim 13, wherein:

said detecting unit determines a certain threshold value g and detects whether $|P \cdot G(i, t) - Q \cdot G(j, t) - O| \leq g$ or $|P \cdot G(i, t) - Q \cdot G(j, t) - O| > g$ is satisfied, wherein $G(i, t)$ and $G(j, t)$ denote data which are obtained by correcting the pattern data generated by the pattern generating unit in two exposure systems, t denotes time, P, Q and O are parameters for considering differences between states of the column units, and i and j are identifiers for the charged particle beam exposure systems; and said notifying unit generates no error signal if $|P \cdot G(i, t) - Q \cdot G(j, t) - O| \leq g$ is satisfied and generates an error signal and notifies the abnormality to the host unit if $|P \cdot G(i, t) - Q \cdot G(j, t) - O| > g$ is satisfied.

15. The charged particle beam exposure apparatus as claimed in claim 13, wherein:

said detecting unit determines a certain range $\delta$ and detects whether $|R \cdot I(i, t) - S \cdot I(j, t) - O| \leq \delta$ or $|R \cdot I(i, t) - S \cdot I(j, t) - O| > \delta$ is satisfied, where $I(i, t)$ and $I(j, t)$ denote data related to current values at aperture stop parts or reflected charged particle beam intensities at wafer stage parts within the column units of two exposure systems, t denotes time, O, R and S are parameters for considering differences between the current densities of the column units, and i and j are identifiers for the charged particle beam exposure systems; and said notifying unit generates no error signal if $|R \cdot I(i, t) - S \cdot I(j, t) - O| \leq \delta$ is satisfied and generates an error signal and notifies the abnormality to the host unit if $|R \cdot I(i, t) - S \cdot I(j, t) - O| > \delta$ is satisfied.

16. The charged particle beam exposure apparatus as claimed in claim 13, wherein:

said detection unit compares an absolute value $|P_d \cdot DD_i - Q_d \cdot DD_j| - |O_d||$ and an evaluation value $\delta_d$ by using data $DD_i$ from an exposure system i and data $DD_j$ from and exposure system j, where $P_d$, $Q_d$ and $O_d$ denote parameters; and said notifying unit generates an error signal and notifies the abnormality to the host unit if the absolute value is greater than the evaluation value $\delta_d$.

17. The charged particle beam exposure apparatus as claimed in claim 13, wherein:

said detecting unit compares an absolute value $|P_d \cdot DD_i - Q_d \cdot DD_j| - |R_d \cdot DD_i||$ and an evaluation value $\delta_d$ by using data $DD_i$ from an exposure system i, a deviation $\delta DD_i$ of the data $DD_i$ from the exposure system i during one clock period, and data $DD_j$ from an exposure system j, where $P_d$, $Q_d$ and $R_d$ denote parameters; and said notifying unit generates an error signal and notifies the abnormality to the host unit if the absolute value is greater than the evaluation value $\delta_d$.

18. The charged particle beam exposure apparatus as claimed in claim 13, wherein:

said detecting unit decides whether or not a condition $|_\Delta DD_i - _\Delta DD_j| \geq E \cdot _\Delta DD_m$ is satisfied by using a jumping quantity $_\Delta DD_i = DD_i(new) - DD_i(old)$ of data $DD_i$ from an exposure system for every shot, a jumping quantity $_\Delta DD_j = DD_j(new) - DD_j(old)$ of data $DD_j$ of an exposure system j for every shot, and $_\Delta DD_m = max(|_\Delta DD_i|, |_\Delta DD_j|)$, where E denotes a parameter and $_\Delta DD_m$ denotes a largest one of the jumping quantities $|_\Delta DD_i|$ and $|_\Delta DD_j|$ within a range in which the data $DD_i$ and $DD_j$ change while a pattern is exposed; and said notifies unit generates an error signal and notifies the abnormality to the host unit if the condition $|_\Delta DD_i - _\Delta DD_j| \geq E \cdot _\Delta DD_m$ is satisfied.

19. The charged particle beam exposure apparatus as claimed in claim 13, wherein said error information further includes a time when the abnormality is generated, and which further comprises:

a storing unit to store a log of the abnormality based on the error information notified from said notifying unit.

20. The charged particle beam exposure apparatus as claimed in claim 12, wherein the data which are obtained from the corresponding parts of the exposure systems are at least one kind of data selected from a group consisting of pattern data generated in the pattern generating unit of each of the exposure systems, data which are obtained by correcting the pattern data by a pattern correcting unit in the pattern generating unit of each of the exposure systems, data related to current values at aperture stop parts within the column unit of each of the exposure systems, data related to reflected charged particle beam intensities at wafer stage parts within the column unit of each of the exposure systems.

21. The charged particle beam exposure apparatus as claimed in claim 12, wherein said detecting unit detects the abnormality if the data obtained from the corresponding parts of at least two exposure systems do not match or an error between the data obtained from the corresponding parts of the at least two exposure systems is outside a tolerable range.

22. The charged particle beam exposure apparatus as claimed in claim 12, wherein the column units of the exposure systems, respectively have objects mounted on independent stages, and which further comprises:

a movement unit to move the stages so as to counterbalance each other.

23. A charged particle beam exposure apparatus comprising:

detecting means for detecting an abnormality in the charged particle beam exposure apparatus during operation of the charged particle beam exposure apparatus; and notifying means for notifying error information to a host unit based on data obtained from corresponding parts of exposure systems, wherein said detecting means compares an absolute value $|P_d \cdot DD_i - Q_d \cdot DD_j| - |O_d||$ and an evaluation value $\delta_d$ by using data $DD_i$ from an exposure system i and data $DD_j$ from an exposure system j, where $P_d$, $Q_d$, and $O_d$ denote parameters, and wherein said notifying means generates an error signal and notifies the abnormality to the host unit if the absolute value is greater than the evaluation value $\delta_d$.

24. A charged particle beam exposure method for use with an exposure apparatus which includes a plurality of exposure systems that simultaneously expose the same pattern, comprising:

(a) generating in each exposure system, data related to patterns which are to be exposed;

(b) deflecting in each exposure system, a charged particle beam onto an object which is mounted on a stage by deflecting the charged particle beam based on the data generated by the generating in a corresponding exposure system; and (c) detecting an abnormality in the exposure apparatus during operation of the exposure apparatus based on (i) a comparison of outputs of corresponding shot data decomposing or generating parts in each of the columns, (ii) a comparison of outputs of corresponding pattern data correcting parts in each of the columns, or (iii) a comparison of current values or reflected electron intensities of each of the columns.

* * * * *